US012772621B2

(12) United States Patent
Huang

(10) Patent No.: US 12,772,621 B2
(45) Date of Patent: Oct. 20, 2026

(54) DISPLAY PANEL AND MANUFACTURING METHOD THEREOF, DISPLAY DEVICE, AND ARRAY SUBSTRATE

(71) Applicant: Tianma Advanced Display Technology Institute (Xiamen) Co., Ltd., Xiamen (CN)

(72) Inventor: Zufeng Huang, Xiamen (CN)

(73) Assignee: Tianma Advanced Display Technology Institute (Xiamen) Co., Ltd, Xiamen (CN)

( * ) Notice: Subject to any disclaimer, the term of this patent is extended or adjusted under 35 U.S.C. 154(b) by 357 days.

(21) Appl. No.: 18/383,533

(22) Filed: Oct. 25, 2023

(65) Prior Publication Data

US 2024/0055564 A1 Feb. 15, 2024

(30) Foreign Application Priority Data

Jun. 30, 2023 (CN) ......................... 202310790991.7

(51) Int. Cl.

| | |
|---|---|
| ***H10H 20/832*** | (2025.01) |
| ***H10H 20/01*** | (2025.01) |
| ***H10W 90/00*** | (2026.01) |

(52) U.S. Cl.

CPC .......... *H10H 20/832* (2025.01); *H10H 20/01* (2025.01); *H10H 20/018* (2025.01); *H10W 90/00* (2026.01)

(58) Field of Classification Search

CPC .... H10D 86/60; H10D 86/411; H10D 86/441; H10H 20/018; H10H 20/832; H10H 20/857; H10H 29/142

See application file for complete search history.

(56) References Cited

U.S. PATENT DOCUMENTS

| | | | | |
|---|---|---|---|---|
| 2013/0210194 A1* | 8/2013 | Bibl | .................. | H10W 72/0198 438/107 |
| 2020/0381590 A1* | 12/2020 | Yanagisawa | ......... | H10H 20/832 |
| 2022/0102603 A1* | 3/2022 | Choi | .................... | H10H 20/857 |
| 2023/0387357 A1* | 11/2023 | Ma | ..................... | H10H 20/8506 |

FOREIGN PATENT DOCUMENTS

| | | |
|---|---|---|
| CN | 102104090 A | 6/2011 |
| CN | 113594305 A | 11/2021 |
| CN | 218123408 | 12/2022 |

* cited by examiner

*Primary Examiner* — Fazli Erdem

(74) *Attorney, Agent, or Firm* — KDW Firm PLLC

(57) ABSTRACT

Provided are a display panel, a manufacturing method thereof, a display device, and an array substrate. The display panel includes an array substrate, light-emitting diodes, and a bonding layer including bonding portions. A first bonding portion of the bonding portions includes a first intermetallic compound portion. A second bonding portion of the bonding portions includes a first metal portion and a second intermetallic compound portion that are stacked. The first intermetallic compound portion includes a first metal element and a second metal element. The first metal portion includes the first metal element, and the second intermetallic compound portion includes the second metal element. The melting point of a pure metal or an alloy formed from the second metal element is lower than that of a pure metal or an alloy formed from the first metal element.

19 Claims, 10 Drawing Sheets

B-B

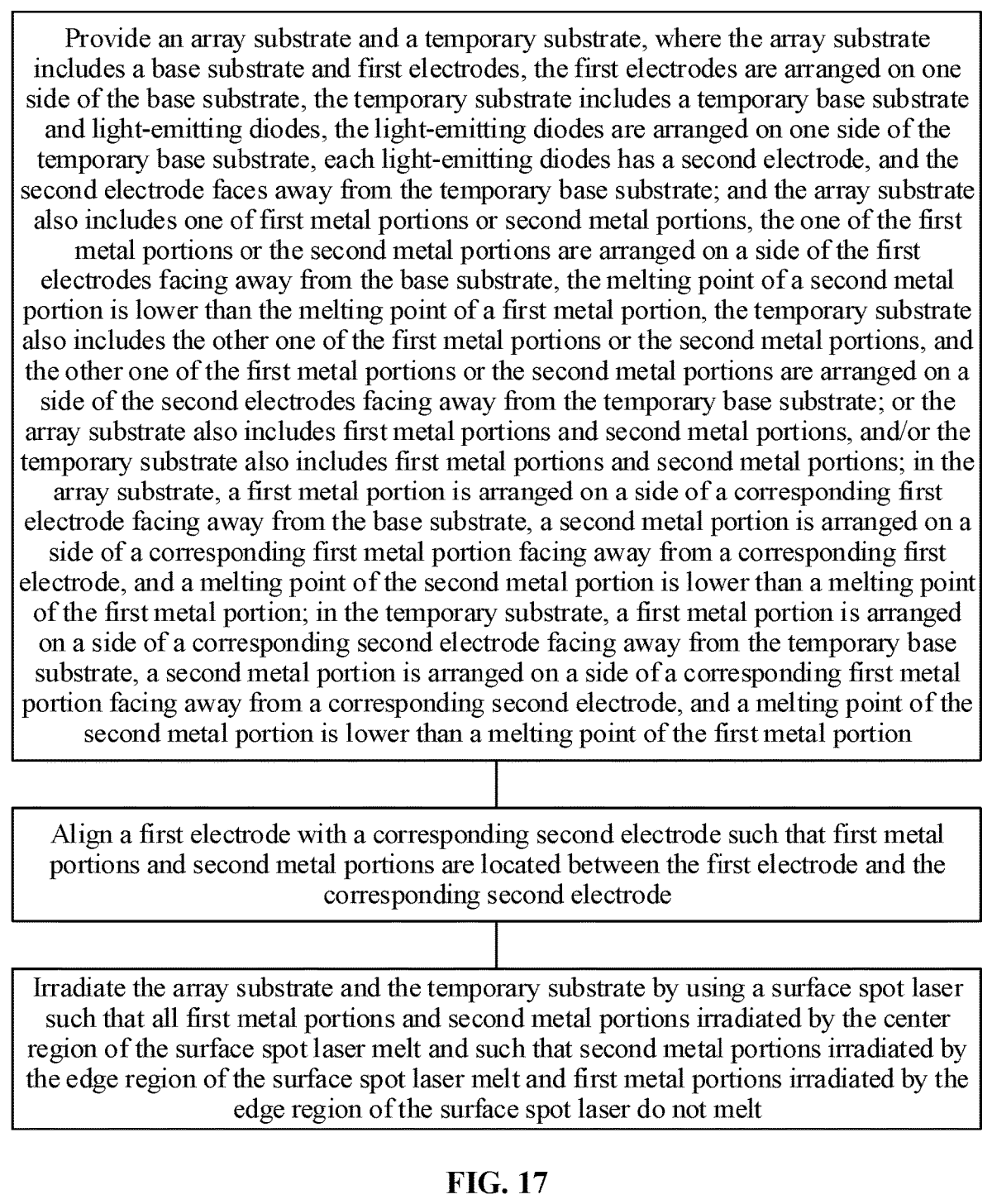

Provide an array substrate and a temporary substrate, where the array substrate includes a base substrate and first electrodes, the first electrodes are arranged on one side of the base substrate, the temporary substrate includes a temporary base substrate and light-emitting diodes, the light-emitting diodes are arranged on one side of the temporary base substrate, each light-emitting diodes has a second electrode, and the second electrode faces away from the temporary base substrate; and the array substrate also includes one of first metal portions or second metal portions, the one of the first metal portions or the second metal portions are arranged on a side of the first electrodes facing away from the base substrate, the melting point of a second metal portion is lower than the melting point of a first metal portion, the temporary substrate also includes the other one of the first metal portions or the second metal portions, and the other one of the first metal portions or the second metal portions are arranged on a side of the second electrodes facing away from the temporary base substrate; or the array substrate also includes first metal portions and second metal portions, and/or the temporary substrate also includes first metal portions and second metal portions; in the array substrate, a first metal portion is arranged on a side of a corresponding first electrode facing away from the base substrate, a second metal portion is arranged on a side of a corresponding first metal portion facing away from a corresponding first electrode, and a melting point of the second metal portion is lower than a melting point of the first metal portion; in the temporary substrate, a first metal portion is arranged on a side of a corresponding second electrode facing away from the temporary base substrate, a second metal portion is arranged on a side of a corresponding first metal portion facing away from a corresponding second electrode, and a melting point of the second metal portion is lower than a melting point of the first metal portion Align a first electrode with a corresponding second electrode such that first metal portions and second metal portions are located between the first electrode and the corresponding second electrode Irradiate the array substrate and the temporary substrate by using a surface spot laser such that all first metal portions and second metal portions irradiated by the center region of the surface spot laser melt and such that second metal portions irradiated by the edge region of the surface spot laser melt and first metal portions irradiated by the edge region of the surface spot laser do not melt

FIG. 17

DISPLAY PANEL AND MANUFACTURING METHOD THEREOF, DISPLAY DEVICE, AND ARRAY SUBSTRATE

CROSS-REFERENCE TO RELATED APPLICATIONS

This application claims priority to Chinese patent application No. 202310790991.7 filed with the China National Intellectual Property Administration (CNIPA) on Jun. 30, 2023, the disclosure of which is incorporated herein by reference in its entirety.

TECHNICAL FIELD

The present application relates to the field of display technology and, in particular, to a display panel, a manufacturing method thereof, a display device, and an array substrate.

BACKGROUND

With the progress of science and technology, digital display devices such as smartphones and tablet computers are widely used. Among these display devices, a display panel is an indispensable interpersonal communication interface. For example, a micro light-emitting diode (microLED) display panel has the advantages of being self-luminous, energy-saving, cost-reducing, bendable, and flexible. Moreover, a display device with such a display panel does not need a backlight and has the characteristics of fast reaction and good display effect, thus attracting the attention of users and being widely used in terminal products such as smartphones and tablet computers.

A mass transfer technique for microLEDs is to transfer microLEDs from a temporary substrate to an array substrate of a display panel. However, after the microLEDs are mass transferred, the microLEDs are poorly connected to the array substrate, resulting in a reduced production yield of the display panel.

SUMMARY

The present application provides a display panel and a display device to improve the production yield of microLEDs after a mass transfer technique is performed.

An embodiment of the present application provides a display panel. The display panel includes a display region. The display region includes a light-emitting diode region. The light-emitting diode region includes a first region and a second region. The second region surrounds at least part of the first region. The display panel includes an array substrate, multiple light-emitting diodes, and a bonding layer. The array substrate includes first electrodes. The multiple light-emitting diodes are arranged on one side of the array substrate. The bonding layer is arranged between the first electrodes and the multiple light-emitting diodes. The bonding layer includes multiple discrete bonding portions. A bonding portion connects a light-emitting diode and a corresponding first electrode. The bonding portions include first bonding portions and second bonding portions. The first bonding portions are in the first region. A first bonding portion includes a first intermetallic compound portion. The second bonding portions are in the second region. A second bonding portion includes a first metal portion and a second intermetallic compound portion that are stacked. The first intermetallic compound portion includes a first metal element and a second metal element. The first metal portion includes the first metal element. The second intermetallic compound portion includes the second metal element. The melting point of a pure metal formed from the second metal element or the melting point of an alloy formed from the second metal element is lower than the melting point of a pure metal formed from the first metal element or the melting point of an alloy formed from the first metal element.

An embodiment of the present application provides a display device. The display device includes the display panel provided in the preceding embodiment.

An embodiment of the present application provides an array substrate. The array substrate includes a base substrate and first electrodes. The first electrodes are arranged on one side of the base substrate. The array substrate also includes one of first metal portions or second metal portions. The one of the first metal portions or the second metal portions is arranged on a side of the first electrodes facing away from the base substrate. The melting point of a second metal portion is lower than the melting point of a first metal portion. Alternatively, the array substrate also includes first metal portions and second metal portions. A first metal portion is arranged on a side of a corresponding first electrode facing away from the base substrate. A second metal portion is arranged on a side of a corresponding first metal portion facing away from a corresponding first electrode. The melting point of the second metal portion is lower than the melting point of the first metal portion.

An embodiment of the present application provides a temporary base substrate. The temporary substrate includes a temporary substrate and light-emitting diodes. The light-emitting diodes are arranged on one side of the temporary base substrate. Each light-emitting diode has a second electrode. The temporary substrate also includes one of first metal portions or second metal portions. The one of the first metal portions or the second metal portions is arranged on a side of the second electrode facing away from the temporary base substrate. The melting point of a second metal portion is lower than the melting point of a first metal portion. Alternatively, the temporary substrate also includes first metal portions and second metal portions. A first metal portion is arranged on a side of a corresponding second electrode facing away from the temporary substrate. A second metal portion is arranged on a side of a corresponding first metal portion facing away from a corresponding second electrode. The melting point of the second metal portion is lower than the melting point of the first metal portion.

An embodiment of the present application provides a manufacturing method of a display panel. The manufacturing method includes the following:

An array substrate and a temporary substrate are provided. The array substrate includes a base substrate and first electrodes arranged on one side of the base substrate. The temporary substrate includes a temporary base substrate and light-emitting diodes arranged on one side of the temporary base substrate. Each light-emitting diode has a body portion and a second electrode arranged on a side of the body portion facing away from the temporary base substrate. The array substrate also includes one of first metal portions or second metal portions. The one of the first metal portions or the second metal portions is arranged on a side of the first electrodes facing away from the base substrate. The melting point of a second metal portion is lower than the melting point of a first metal portion. The temporary substrate also includes the other one of the first metal portions or the second metal portions. The other one of the first metal portions or the second metal portions is arranged on a side of the second electrode facing away from the temporary base substrate. Alternatively, the array substrate and/or the temporary substrate also includes first metal portions and second metal portions. In the array substrate, a first metal portion is arranged on a side of a corresponding first electrode facing away from the base substrate, a second metal portion is arranged on a side of a corresponding first metal portion facing away from a corresponding first electrode, and the melting point of the second metal portion is lower than the melting point of the first metal portion. In the temporary substrate, a first metal portion is arranged on a side of a corresponding second electrode facing away from the temporary base substrate, a second metal portion is arranged on a side of a corresponding first metal portion facing away from a corresponding second electrode, and the melting point of the second metal portion is lower than the melting point of the first metal portion.

A first electrode of the first electrodes is aligned with a corresponding second electrode such that a corresponding first metal portion and a corresponding second metal portion are located between the first electrode and the corresponding second electrode.

The array substrate and the temporary substrate are irradiated by using a surface spot laser such that all first metal portions and second metal portions irradiated by the center region of the surface spot laser melt and such that second metal portions irradiated by the edge region of the surface spot laser melt and first metal portions irradiated by the edge region of the surface spot laser do not melt.

BRIEF DESCRIPTION OF DRAWINGS

The features, advantages and technical effects of example embodiments of the present application will be described below with reference to drawings. The same components use the same reference numerals in the drawings. The drawings are not drawn to actual scale.

FIG. 17 is a flowchart of a manufacturing method of a display panel according to an embodiment of the present application.

Figure 1:
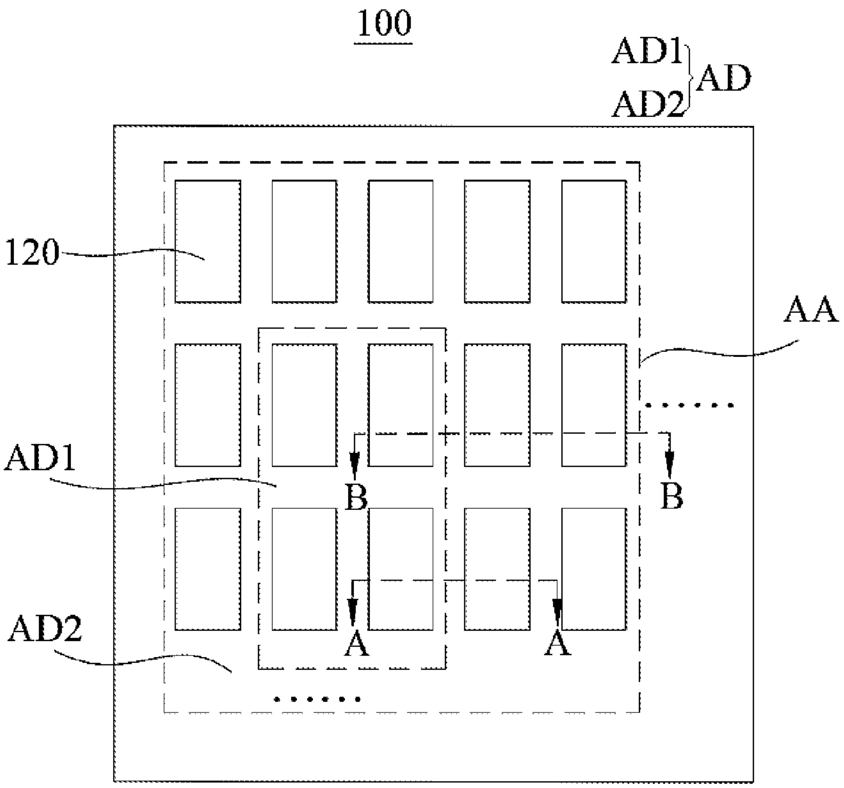
FIG. 1 is a top view of a display panel according to an embodiment of the present application.

The drawings are not necessarily drawn to actual scale in the drawings.

REFERENCE LIST

100 display panel
110 array substrate
111 base substrate
112 first electrode
120 light-emitting diode
121 second electrode
122 body portion
130 bonding layer
131 bonding portion
132 first bonding portion
1321 first intermetallic compound portion
133 second bonding portion
1331 second intermetallic compound portion
1332 first bonding sub-portion
1333 second bonding sub-portion
200 first metal portion
300 second metal portion
400 temporary substrate
410 temporary base substrate
10 display device
AA display region
AD light-emitting diode region
AD1 first region
AD2 second region

DETAILED DESCRIPTION

The features and example embodiments of various aspects of the present application are described in detail below. In the detailed description below, many details are presented in order to provide a comprehensive understanding of the present application. However, it is clear to those skilled in the art that the present application can be implemented without some of these details. The description of the embodiments below is only to provide a better understanding of the present application by illustration of examples of the present application. In the drawings and the following description, at least some of the known structures and techniques are not illustrated in order to avoid unnecessary ambiguity to the present application. Moreover, the dimensions of some structures may be exaggerated for clarity. Further, the features, structures, or characteristics described below may be combined in one or more embodiments in any suitable manner.

Further, the dimension and thickness of each configuration in the drawings are arbitrarily illustrated for better understanding and easier description, but the present application concept is not limited thereto. In the drawings, the thickness of the layer, film, panel, region, etc. is enlarged for clarity. In the drawings, the thicknesses of some layers and regions are enlarged for better understanding and easier description.

It can be understood that when an element of a layer, film, region, or substrate is described as "on" another element, the element may be directly on the other element, or there may also be an intermediate element. In contrast, when the element is described as "directly on" another element, there is no intermediate element. In addition, throughout the specification, the word "on" means positioned above or below the target element and does not necessarily mean positioned "on the upper side" based on the gravity direction.

In addition, unless expressly stated to the contrary, the word "include" will be understood to imply the inclusion of the elements stated, but not to exclude any other elements.

In a process of manufacturing a display panel, multiple light-emitting diodes, such as microLEDs (that is, light-emitting diodes of a micron size), are usually first formed on a temporary substrate and then transferred from the temporary substrate to an array substrate of the display panel through a mass transfer technique. In other embodiments, microLEDs may be transferred, through a mass transfer technique, from an epitaxial substrate of an epitaxial film forming a light-emitting diode to an array substrate of a display panel. In a process of performing mass transfer on the light-emitting diodes, surface spot laser irritation is usually used so that a film between the light-emitting diodes and first electrodes of an array substrate forms a bonding layer, thereby realizing an electrical connection between the array substrate and the light-emitting diodes. In a process of mass transfer, irradiation regions of a surface spot laser on an array substrate and a temporary substrate are distributed in a planar shape, and shapes of the irradiation regions of the surface spot laser may be set according to needs. In this manner, the surface spot laser can simultaneously irradiate multiple light-emitting diodes arranged in at least two intersecting directions.

However, in related art, the temperatures in the irradiation regions of the surface spot laser increase. Since the heat dissipation rate of an edge region in the irradiation regions of the surface spot laser is relatively fast, the temperature of a center region in the irradiation regions of the surface spot laser is higher than the temperature of the edge region in the irradiation regions of the surface spot laser. In this manner, in a bonding process, if a surface spot laser with a relatively high temperature is used, a bonding temperature of an edge region in the irradiation regions of the surface spot laser is appropriate, but a bonding temperature of a center region in the irradiation regions of the surface spot laser is relatively high, increasing fluidity of a melted bonding layer and causing a risk of short circuit of the microLEDs. In addition, an excessively high bonding temperature may cause damage to an array substrate. If a surface spot laser with a relatively low temperature is used, the bonding temperature of the center region in the irradiation regions of the surface spot laser is appropriate, but the bonding temperature of the edge region in the irradiation regions of the surface spot laser is relatively low, easily causing poor bonding between a microLED and an array substrate in the edge region. In this manner, no matter what temperature a surface spot laser is used, uneven temperatures in the irradiation regions of the surface spot laser easily cause a relatively low production yield of a mass transfer technique for microLEDs.

In view of this, embodiments of the present application provide a display panel and a display device using the display panel to improve the production yield of the display panel.

As shown in FIGS. 1 to 4, an embodiment of the present application provides a display panel 100. The display panel 100 includes a display region AA that includes a light-emitting diode region AD. The light-emitting diode region AD includes a first region AD1 and a second region AD2 that surrounds at least part of the first region AD1. The display panel 100 includes an array substrate 110, a plurality of light-emitting diodes 120, and a bonding layer 130. The array substrate 110 includes a plurality of first electrodes 112. The plurality of light-emitting diodes 120 are arranged on one side of the array substrate 110. The bonding layer 130 is arranged between the plurality of first electrodes 112 and the plurality of light-emitting diodes 120, and includes a plurality of discrete bonding portions 131. A bonding portion 131 connects a light-emitting diode 120 to a corresponding first electrode 112. The plurality of bonding portions 131 include first bonding portions 132 and second bonding portions 133. The first bonding portions 132 are in the first region AD1, and a first bonding portion 132 includes a first intermetallic compound portion 1321. The second bonding portions 133 are in the second region AD2, and a second bonding portion 133 includes a first metal portion 200 and a second intermetallic compound portion 1331 that are stacked. The first intermetallic compound portion 1321 includes a first metal element and a second metal element. The first metal portion 200 includes the first metal element, and the second intermetallic compound portion 1331 includes the second metal element. The melting point of a pure metal formed from the second metal element or the melting point of an alloy formed from the second metal element is lower than the melting point of a pure metal formed from the first metal element or the melting point of an alloy formed from the first metal element.

The display panel 100 includes the display region AA capable of realizing a display function of the display panel 100. In an embodiment, the display panel 100 may include only the display region AA; alternatively, the display panel 100 may include the display region AA and also a non-display region. The display region AA includes the light-emitting diode region AD used for setting the plurality of light-emitting diodes 120. A light-emitting diode 120 may be a microLED, which refers to a light-emitting diode of a micron size.

The light-emitting diode region AD includes the first region AD1 and the second region AD2 surrounding at least part of the first region AD1. In an embodiment, the second region AD2 may surround the circumference of the first region AD1. Alternatively, the second region AD2 surrounds a part of the circumference of the first region AD1.

The first region AD1 may be circular, rectangular, or otherwise shaped, and correspondingly, the second region AD2 may be circular, square, or otherwise shaped.

The array substrate 110 may include a pixel driving circuit. A first electrode 112 of the pixel driving circuit may be electrically connected to a light-emitting diode 120 by the bonding layer 130 to drive the light-emitting diode 120 to emit light normally.

Each light-emitting diode 120 may include a body portion 122 and a second electrode 121. For example, the light-emitting diode is a microLED that may be of a formal structure, a vertical structure, or a flip structure. Both the microLED of the formal structure and the microLED of the flip structure have the positive and negative electrodes on the same side of the respective body portion 122. Therefore, the microLED of the formal structure and the microLED of the flip structure each have two second electrodes 121. The two second electrodes 121 are connected to two corresponding first electrodes 112 of the array substrate 110. The positive and negative electrodes of the microLED of the vertical structure are separately arranged on the two sides of the body portion 122. Therefore, the microLED of the vertical structure has only one second electrode 121 on a side facing the array substrate 110. That is, the microLED of the vertical structure has only one second electrode 121 connected to a corresponding first electrode 112 of the array substrate 110. In an embodiment, the body portion 122 of the light-emitting diode 120 may include an N-type semiconductor layer, a quantum well layer, and a P-type semiconductor layer that are stacked. Taking a GaN-based light-emitting diode as an example, the body portion 122 of the light-emitting diode 120 may include an N-type GaN layer, an active layer, a P-type GaN layer, and a sapphire base substrate. The second electrodes 121 include P electrodes and N electrodes.

Figure 2:
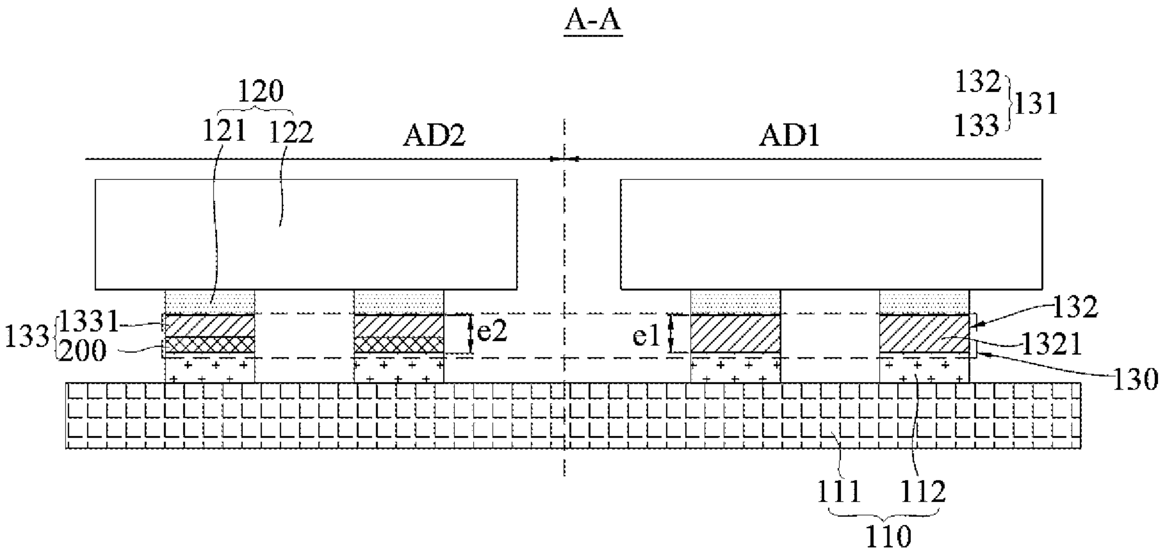
FIG. 2 is a sectional view of FIG. 1 along A-A.

In FIG. 2, a light-emitting diode 120 of the flip structure is shown as an example. This type of light-emitting diode 120 may include two second electrodes 121. One of the two second electrodes 121 is a positive electrode, and the other second electrode is a negative electrode. The two second electrodes 121 are arranged on the side of the body portion 122 facing the array substrate 110 and are connected to two corresponding first electrodes 112 of the array substrate 110 via bonding portions 131. In this manner, the array substrate 110 inputs voltages to the plurality of light-emitting diodes 120 and drives the light-emitting diodes 120 to emit light.

It is to be noted that in the drawings, unless otherwise specified, structures filled with the same pattern may represent the same structure.

The plurality of light-emitting diodes 120 may include light-emitting diodes that emit three different colors of light respectively. Illustratively, the plurality of light-emitting diodes 120 include light-emitting diodes that emit red light, light-emitting diodes that emit blue light, and light-emitting diodes that emit green light. In an embodiment, light-emitting diodes 120 on a temporary substrate 400 may emit the same color of light. In this manner, in a process of mass transfer, only light-emitting diodes 120 that emit the same color of light are transferred by the mass transfer at one time, and all light-emitting diodes 120 are transferred by the mass transfer at least three times. Alternatively, light-emitting diodes 120 that emit two or three different colors of light are included in a temporary substrate 400. In this manner, the light-emitting diodes 120 that emit two or three different colors of light are transferred in one mass transfer process. It can be selected according to actual needs, which is not limited here.

A bonding portion 131 is electrically connected to a light-emitting diode 120. The bonding portion 131 connects a first electrode 112 and a corresponding second electrode 121 of the light-emitting diode 120. The bonding portion 131 is in contact with and is electrically connected to a corresponding second electrode 121 of the light-emitting diode 120, so that the light-emitting diode 120 is electrically connected to the corresponding first electrode 112 of the array substrate 110. In an embodiment, the material of a second electrode 121 may include a tin element or aurum (Au).

The bonding layer 130 includes the plurality of discrete bonding portions 131 that are spaced apart. In a process of performing mass transfer on the plurality of light-emitting diodes 120, at least part of metals between the plurality of light-emitting diodes 120 and the plurality of first electrodes 112 melt and solidify to form the plurality of bonding portions 131. A bonding portion of the plurality of bonding portions 131 connects a light-emitting diode of the plurality of light-emitting diodes 120 and a corresponding first electrode 112.

In an embodiment, the second metal element may include one or more metal elements. When the second metal element includes only one metal element, a pure metal is formed. When the second metal element includes two or more metal elements, an alloy composed of all metal elements is formed. Similarly, the first metal element may include one or more metal elements. When the first metal element includes only one metal element, a pure metal is formed. When the first metal element includes two or more metal elements, an alloy composed of all metal elements is formed.

The melting point of the pure metal formed from the second metal element or the melting point of the alloy formed from the second metal element is lower than the melting point of the pure metal formed from the first metal element or the melting point of the alloy formed from the first metal element. The first bonding portion 132 includes the first intermetallic compound portion 1321. The second bonding portion 133 includes the first metal portion 200 and the second intermetallic compound portion 1331 that are stacked. The first intermetallic compound portion 1321 includes the first metal element and the second metal element. The first metal portion 200 includes the first metal element, and the second intermetallic compound portion 1331 includes the second metal element. In this manner, before surface spot laser irradiation is used to bond a light-emitting diode of the plurality of light-emitting diodes 120 with a first electrode of the plurality of first electrodes 112 of the array panel 110, the first metal portion 200 and a second metal portion 300 may be stacked between the light-emitting diode 120 and the first electrode 112. The first metal portion 200 is the pure metal formed from the first metal element or the alloy formed from the first metal element. The second metal portion 300 is the pure metal formed from the second metal element or the alloy formed from the second metal element. Thus, the melting point of the second metal portion 300 is lower than the melting point of the first metal portion 200.

In an embodiment, the array substrate 110 shown in FIGS. 7 to 10 and the temporary substrate 400 shown in FIGS. 11 to 14 that cooperate with each other may be selected for mass transfer. Before the light-emitting diodes 120 on the temporary substrate 400 are transferred to the array substrate 110, the first metal portions 200 and the second metal portions 300 may be arranged on the array substrate 110. Alternatively, the first metal portions 200 and the second metal portions 300 may be arranged on the temporary substrate 400. Alternatively, one of the first metal portions 200 or the second metal portions 300 may be arranged on the array substrate 110, and the other one of the first metal portions 200 or the second metal portions 300 may be arranged on the temporary substrate 400. Of course, the first metal portions 200 and the second metal portions 300 may be arranged on both the array substrate 110 and the temporary substrate 400.

In this manner, in a process of using surface spot laser irradiation to bond the light-emitting diodes 120 with the first electrodes 112, the center region of a surface spot laser corresponds to the first region AD1 of the display panel 100, and the edge region of the surface spot laser corresponds to the second region AD2 of the display panel 100. Since the temperature of the edge region of the surface spot laser is lower than the temperature of the center region of the surface spot laser, energy of the surface spot laser and the melting points of the first metal portion 200 and the second metal portion 300 may be reasonably set. In this manner, all the first metal portions 200 and second metal portions 300 in the first region AD1 melt and then solidify to form the first intermetallic compound portions 1321 and further form the first bonding portions 132, while in the second region AD2, only the second metal portions 300 melt and the first metal portions 200 do not melt. Thus, after the bonding is completed, the first metal portions 200 between first electrodes 112 and light-emitting diodes 120 in the second region AD2 remain, and the second metal portions 300 between the first electrodes 112 and the light-emitting diodes 120 in the second region AD2 melt. In addition, in a process that the second metal portions 300 melt, although the first metal portions 200 do not melt, the first metal elements in the first metal portions 200 are incorporated into the melted second metal portions 300. These first metal elements together with the melted second metal portions 300 form the second intermetallic compound portions 1331, and the second intermetallic compound portions 1331 together with the first metal portions 200 form the second bonding portions 133. Illustratively, the energy of the surface spot laser is reasonably set, so that the temperature of the first region AD1 under laser irradiation is higher than the melting point of the first metal portion 200 and higher than the melting point of the second metal portion 300, and the temperature of the second region AD2 under the laser irradiation is higher than the melting point of the second metal portion 300 but smaller than the melting point of the first metal portion 200.

Figure 3:
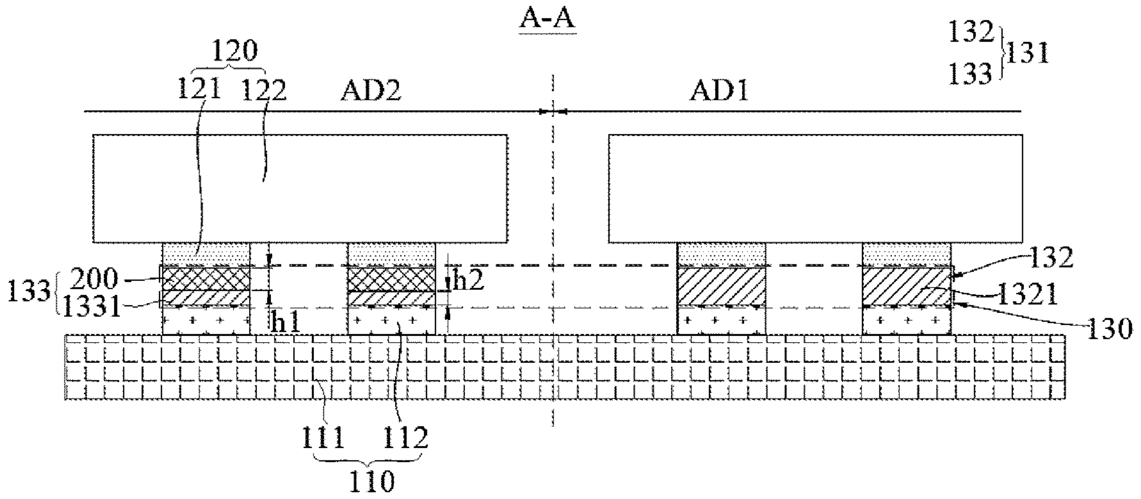
FIG. 3 is another sectional view of FIG. 1 along A-A.
Figure 4:
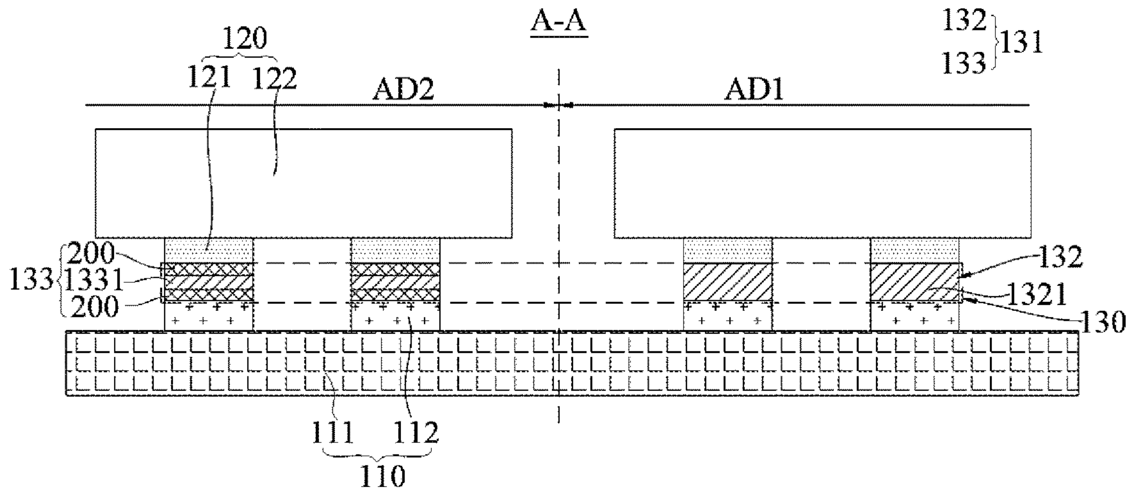
FIG. 4 is another sectional view of FIG. 1 along A-A.

The second bonding portion 133 includes the first metal portion 200 and the second intermetallic compound portion 1331 that are stacked. In an embodiment, as shown in FIG. 2, the first metal portion 200 may be arranged on a side of the second intermetallic compound portion 1331 facing the first electrode 112. Alternatively, as shown in FIG. 3, the first metal portion 200 may be arranged on a side of the second intermetallic compound portion 1331 facing the light-emitting diode 120. Alternatively, as shown in FIG. 4, the first metal portions 200 may be arranged on the side of the second intermetallic compound portion 1331 facing the first electrode 112 and also the side of the second intermetallic compound portion 1331 facing the light-emitting diode 120, which may be selected according to actual needs.

Figure 7:
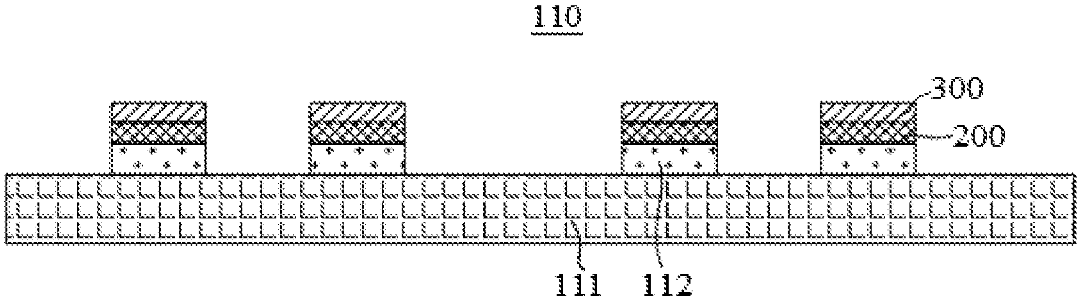
FIG. 7 is a sectional view of an array substrate according to an embodiment of the present application.
Figure 11:
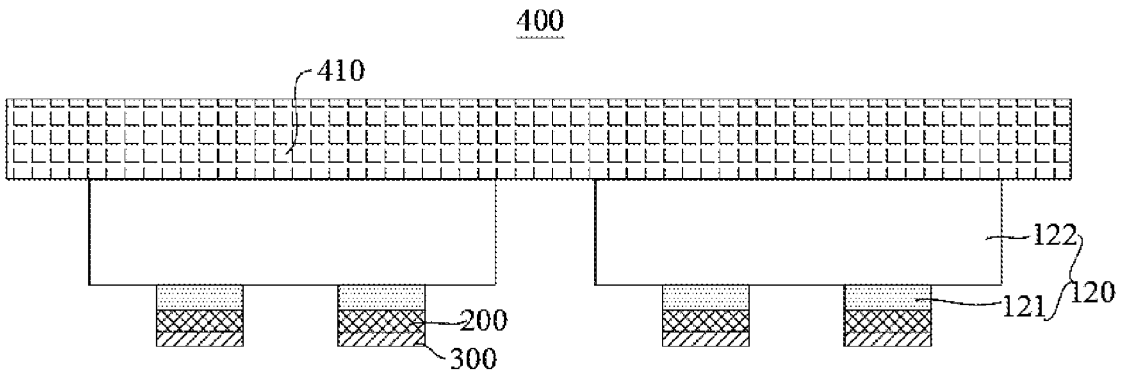
FIG. 11 is a sectional view of a temporary substrate according to an embodiment of the present application.

Therefore, before the surface spot laser is used for bonding, the first metal portions 200 or the second metal portions 300 may be formed on a side of the first electrodes 112 facing the light-emitting diodes 120, and the other one of the first metal portions 200 and the second metal portions 300 may be formed on a side of the light-emitting diodes 120 facing the first electrodes 112, as shown in FIGS. 8, 9, 12, and 13. Alternatively, as shown in FIG. 7, a first metal portion 200 and a second metal portion 300 are stacked on a first electrode 112, and the first metal portion 200 is arranged between the first electrode 112 and the second metal portion 300. That is, the second metal portion 300 having a lower melting point is arranged facing the light-emitting diode 120. Alternatively, as shown in FIG. 11, a first metal portion 200 and a second metal portion 300 are stacked on the light-emitting diode 120, and the first metal portion 200 is arranged between the light-emitting diode 120 and the second metal portion 300. That is, the second metal portion 300 having a lower melting point is arranged facing the light-emitting diode 120. Of course, the first metal portion 200 and the second metal portion 300 may be arranged on both the light-emitting diode 120 and the first electrode 112, and the second metal portions 300 on the light-emitting diode 120 and the first electrode 112 may be arranged adjacent to each other. It can be selected according to actual needs, which is not limited herein.

It is to be noted that, in the case where both the first metal portions 200 and the second metal portions 300 are arranged on the array substrate 110, the second metal portions 300 are always arranged on the most outer side facing away from the base substrate 111. In this manner, when irradiated by using the surface spot laser, the second metal portions 300 on the most outer side always melt and solidify to be connected to the light-emitting diodes 120. Similarly, in the case where both the first metal portions 200 and the second metal portions 300 are arranged on the temporary substrate 400, the second metal portions 300 are always arranged on the most outer side facing away from a temporary base substrate 410. In this manner, when irradiated by using the surface spot laser, the second metal portions 300 on the most outer side always melt and solidify to be connected to the first electrodes 112.

It is to be noted that after the mass transfer technique for the display panel 100 is completed, the first metal portion 200 and the second metal portion 300 arranged in different manners correspond to different structures. Illustratively, to form the display panel 100 shown in FIG. 2, the array substrate 110 shown in FIG. 7 and the temporary substrate 400 shown in FIG. 14 may be used for a corporation to perform the mass transfer, or the array substrate 110 shown in FIG. 8 and the temporary substrate 400 shown in FIG. 13 may be used for a corporation to perform the mass transfer. To form the display panel 100 shown in FIG. 3, the array substrate 110 shown in FIG. 9 and the temporary substrate 400 shown in FIG. 11 may be used for a corporation to perform the mass transfer, or the array substrate 110 shown in FIG. 9 and the temporary substrate 400 shown in FIG. 12 may be used for a corporation to perform the mass transfer. To form the display panel 100 shown in FIG. 4, the array substrate 110 shown in FIG. 7 and the temporary substrate 400 shown in FIG. 11 may be used for a corporation to perform the mass transfer.

It can be understood that, according to different temperatures and different bonding environments of the surface spot laser in a bonding process, there is an obvious dividing line between a region where the first metal portions 200 melt and a region where the first metal portions 200 do not melt. However, the position of this dividing line is not fixed. Therefore, although there is an explicit dividing line between the first region AD1 and the second region AD2 in the display panel 100 manufactured and formed after the mass transfer, the dividing line between the first region AD1 and the second region AD2 is not fixed.

It can be understood that according to different sizes of the irradiation region of the surface spot laser, only one light-emitting diode 120 may be in the first region AD1, or a plurality of light-emitting diodes 120 may be in the first region AD1. Similarly, only one light-emitting diode 120 may be in the second region AD2, or a plurality of light-emitting diodes 120 may be in the second region AD2.

In an embodiment, the display panel 100 may be provided with one first region AD1 and one second region AD2. Alternatively, the display panel 100 may be provided with a plurality of first regions AD1 and a plurality of second regions AD2, and two adjacent first regions AD1 may share at least part of a second region AD2. Illustratively, the plurality of first regions AD1 and the plurality of second regions AD2 are arranged at intervals, and the areas occupied by different first regions AD1 are equivalent.

The embodiments of the present application provide a display panel 100, in which the first bonding portions 132 are in the first region AD1, and the second bonding portions 133 are in the second region AD2, a first bonding portion 132 includes a first intermetallic compound portion 1321, and a second bonding portion 133 includes a first metal portion 200 and a second intermetallic compound portion 1331 that are stacked. The first intermetallic compound portion 1321 includes a first metal element. The second intermetallic compound portion 1331 includes the second metal element. The melting point of a pure metal formed from the second metal element or the melting point of an alloy formed from the second metal element is set to be lower than the melting point of a pure metal formed from the first metal element or the melting point of an alloy formed from the first metal element. Before a surface spot laser is used to bond a light-emitting diode 120 with a first electrode 112, the first metal portion 200 and the second metal portion 300 may be stacked between the first electrode 112 and the light-emitting diode 120. The first metal portion 200 is the pure metal formed from the first metal element or the alloy formed from the first metal element. The second metal portion 300 is the pure metal formed from the second metal element or the alloy formed from the second metal element. In the process that the first metal portion 200 and the second metal portion 300 are irradiated by using the surface spot laser, a reasonable temperature of the surface spot laser may be selected. In this manner, the center region of the surface spot laser is arranged to correspond to the first region AD1, and the edge region of the surface spot laser is arranged to correspond to the second region AD2. All the first metal portions 200 and the second metal portions 300 in the first region AD1 melt. The second metal portions 300 in the second region melt, and the first metal portions 200 in the second region AD2 do not melt. Thus, a risk of short circuit of the light-emitting diodes 120 caused by high fluidity of a melted first bonding portion 132 due to an excessively high temperature of the center region of the surface spot laser is reduced, and a risk of damage to the array substrate 110 due to the excessively high temperature of the center region of the surface spot laser is reduced. The poor bonding between the light-emitting diodes 120 and the first electrodes 112 due to an excessively low temperature of the edge region of the surface spot laser is better reduced, which is conducive to improving the production yield of the display panel 100.

As shown in FIG. 2, in some embodiments, the thickness of the first intermetallic compound portion is e1, and a sum of the thicknesses of the second intermetallic compound portion and the thickness of the first metal portion is e2, where e1≥e2.

It can be understood that before or after the first metal portion 200 and the second metal portion 300 are irradiated by using the surface spot laser, substances of the first metal portion 200, the second metal portion 300, the first electrode 112, and the second electrode 121 may transfer but have no loss.

In the case where the material of the second electrode 121 has a relatively high melting point, in the first region AD1, all the first metal portions 200 and the second metal portions 300 melt, and a part of metal elements in the second electrodes 121 are incorporated into the first intermetallic compound portions 1321; in the second region AD2, the second metal portions 300 completely melt, and a part of elements in the first metal portions 200 and a part of metal elements in the second electrodes 121 are incorporated into the second intermetallic compound portions 1331. Since the temperature of the first region AD1 is higher than the temperature of the second region AD2, the metal elements incorporated into the first intermetallic compound portions 1321 are more than the metal elements incorporated into the second intermetallic compound portions 1331. Therefore, the thickness of the first bonding portion 132 formed after bonding is larger than the thickness of the second bonding portion 133 formed after bonding. That is, as shown in FIG. 2, the thickness e1 of the first intermetallic compound portion 1321 is larger than the sum e2 of the thicknesses of the second intermetallic compound portion 1331 and the thickness of the first metal portion 200.

In the case where the material of the second electrode 121 has a relatively low melting point, the second electrodes 121 in the first region AD1 completely melt, and the second electrodes 121 in the second region AD2 also melt. The thickness of a formed first bonding portion 132 is equal to the thickness of a formed second bonding portion 133. Correspondingly, the thickness e1 of the first intermetallic compound portion 1321 is equal to the sum e2 of the thicknesses of the second intermetallic compound portion 1331 and the thickness of the first metal portion 200.

Therefore, when e1≥e2, the first bonding portion 132 and the second bonding portion 133 are easily formed, thus improving reliability of an electrical connection between a light-emitting diode 120 and a first electrode 112.

In some embodiments, a light-emitting diode 120 includes a second electrode 121. The second electrode 121 is electrically connected to a corresponding first electrode 112 by the bonding layer 130. The material of the second electrode 121 includes an Au element. The first intermetallic compound portion 1321 and the second intermetallic compound portion 1331 each also include an Au element. The mass content of the Au element in the first intermetallic compound portion 1321 is higher than the mass content of the Au element in the second intermetallic compound portion 1331.

In a process of bonding a first electrode 112 with a corresponding second electrode 121, the Au does not melt but may be incorporated into a melted first metal portion 200 and a melted second metal portion 300. Therefore, the first intermetallic compound portion 1321 formed after bonding and the second intermetallic compound portion 1331 formed after bonding each include the Au element. However, since the temperature of the first region AD1 is higher than the temperature of the second region AD2 in a bonding process, the mass of the metal elements incorporated into the first intermetallic compound portion 1321 is higher than the mass of the metal elements incorporated into the second intermetallic compound portion 1331. Therefore, the mass content of the Au element in the first intermetallic compound portion 1321 is higher than the mass content of the Au element in the second intermetallic compound portion 1331.

The material of the second electrode 121 includes the Au element. The Au element has a relatively high melting point, which is conducive to maintaining stability of structures of the second electrode 121 and the light-emitting diode 120 in a bonding process, and improving the reliability of the electrical connection between the second electrode 121 and the first electrode 112 after a bonding is completed.

Figure 5:
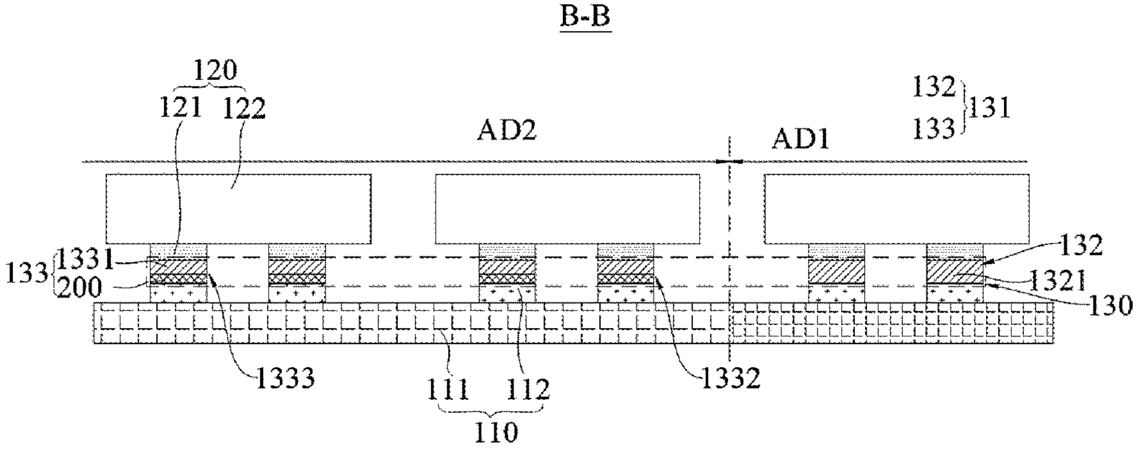
FIG. 5 is a sectional view of FIG. 1 along B-B.

As shown in FIG. 1 and FIG. 5, in some embodiments, a plurality of second bonding portions 133 are arranged in the second region AD2. A second bonding portion 133 includes a first bonding sub-portion 1332 and a second bonding sub-portion 1333. The second bonding sub-portion 1333 is on a side of the first bonding sub-portion 1332 facing away from the first region AD1. The mass content of the Au element in the second intermetallic compound portion 1331 of the second bonding sub-portion 1333 is lower than the mass content of the Au element in the second intermetallic compound portion 1331 of the first bonding sub-portion 1332.

In some embodiments, a plurality of second bonding portions 133 are arranged in the second region AD2. Mass contents of Au elements in the second intermetallic compound portions 1331 of the plurality of second bonding portions 133 decrease incrementally along a direction away from the first region AD1.

It can be understood that, the farther a part of the second region AD2 is from the first region AD1, the lower the temperature of the part in the bonding process, and the lower mass of the Au element incorporated into completely melted second metal portions 300. Therefore, the mass contents of the Au elements in the second intermetallic compound portions 1331 of the plurality of second bonding portions 133 decrease incrementally along the direction away from the first region AD1.

Therefore, it is set that the mass contents of the Au elements in the second intermetallic compound portions 1331 of the plurality of second bonding portions 133 decrease incrementally along the direction away from the first region AD1. Thus, in a bonding process of the second bonding portion 133, the second metal portions 300 in the second region AD2 completely melt and have a better combined effect with the first electrodes 112 or the second electrodes 121, and the second metal portions 300 in the first region AD1 are also completely melted and have a better combined effect with the first electrodes 112 or the second electrodes 121. It is conducive to improving the reliability of the electrical connections between the first electrodes 112 and the second electrodes 121.

In some embodiments, the mass content of the first metal element in the second intermetallic compound portion 1331 is lower than the mass content of the first metal element in the first intermetallic compound portion 1321.

In a bonding process, when both the first region AD1 and the second region AD2 are sufficiently irradiated by the surface spot laser, the first metal portions 200 and the second metal portions 300 in the first region AD1 completely melt and then solidify to form the first intermetallic compound portions 1321. The second metal portions 300 in the second region AD2 completely melt, and the first metal portions 200 in the second region AD2 do not melt, but a part of first metal elements in the first metal portions 200 are incorporated into the melted second metal portions 300 and then solidify to form the second intermetallic compound portions 1331. Since the farther a part of the second region AD2 is from the first region AD1, and the lower the temperature of the part in the bonding process, the lower mass of the first metal elements incorporated into the melted second metal portion 300. That is, the mass contents of the first metal elements in the second intermetallic compound portions 1331 of the second bonding portions 133 decrease incrementally along the direction away from the first region AD1.

As a result, it is conducive to the full melting of the second metal portions 300 in the second region AD2 in the bonding process of the first electrodes 112 and the light-emitting diodes 120. The first metal portions 200 in the first region AD1 and the second metal portions 300 in the first region AD1 fully melt, which is conducive to forming stable second intermetallic compound portions 1331 and stable first intermetallic compound portions 1321, and better improving the reliability of the electrical connections between the first electrodes 112 and the light-emitting diodes 120.

As shown in FIG. 2, in some embodiments, the thickness of the second intermetallic compound portion 1331 is smaller than the thickness of the first metal portion 200.

The thickness of the second intermetallic compound portion 1331 is equivalent to the thickness of the second metal portion 300 before bonding. In an embodiment, a part of materials may be incorporated into the second intermetallic compound portion 1331 in the bonding process. Therefore, the thickness of the second intermetallic compound portion 1331 is slightly greater than the thickness of the second metal portion 300 before bonding, and the thickness of the second intermetallic compound portion 1331 is smaller than the thickness of the first metal portion 200. Thus, the thickness of the second metal portion 300 before bonding is less than the thickness of the first metal portion 200. Since the melting point of the second metal portion 300 is lower than the melting point of the first metal portion 200, it is conducive to reducing fluidity of the melted first metal portions 200 and the melted second metal portions 300 in the first region AD1, and reducing the risk of the short circuit of the light-emitting diode 120 caused by a melted first metal portion 200 and a melted the second metal portion 300 being electrically connected to the two second electrodes 121 of the same light-emitting diode 120.

In some embodiments, the melting point of the pure metal formed from the first metal element or the melting point of the alloy formed from the first metal element is T1, and the melting point of the pure metal formed from the second metal element or the melting point of the alloy formed from the second metal element is T2, where 50° C.≤T1−T2≤100° C.

In an embodiment, T1−T2 may be 50° C., 55° C., 60° C., 65° C., 70° C., 75° C., 80° C., 85° C., 90° C., 95° C., 100° C., etc.

The pure metal formed from the first metal element or the alloy formed from the first metal element is the first mental portion 200, and the pure metal formed from the second metal element or the alloy formed from the second metal element is the second mental portion 300.

After systematic analysis and long-term practice by the inventors, it is found that when it is set that 50° C.≤T1−T2≤100° C., and in a process that the array substrate 110 and the temporary substrate 400 are irradiated by the surface spot laser, it is conducive to setting an appropriate temperature of the surface spot laser, so as to reduce the risk of short circuit of a light-emitting diode 120 due to an excessively high temperature of the surface spot laser and the risk of poor bonding connection due to an excessively low temperature of the surface spot laser.

In some embodiments, the first metal element includes a tin element, and the second metal element includes an indium element.

Thus, before bonding, the first metal portion 200 between the first electrode 112 and the light-emitting diode 120 is tin, and the second metal portion 300 is indium. The melting point of the tin is about 232° C., and the melting point of the indium is about 157° C. The melting points of the tin and indium are relatively low and have a suitable difference. Therefore, a suitable and relatively low temperature of the surface spot laser can be more conveniently selected to reduce the damage of the laser to other structures of the light-emitting diode 120 during the bonding process. In addition, the first bonding portion 132 and the second bonding portion 133 formed after the tin or indium is melted have good conductivity, which is conducive to ensuring the reliability of the electrical connection between the first electrode 112 and the light-emitting diode 120.

In some embodiments, the second metal element includes a tin element and a bismuth element, and the first metal element includes a tin element and a zinc element.

Thus, before bonding, the first metal portion 200 is a tin-zinc alloy, and the second metal portion is a tin-bismuth alloy. Proportions of the tin and the zinc in the first metal portion 200 and proportions of the tin and the bismuth in the second metal portion 300 are reasonably controlled, so that the first metal portion 200 and the second metal portion 300 each have a lower melting point, and the difference between the melting points of the first metal portion 200 and the second metal portion 300 is within an appropriate range. In this manner, an appropriate temperature for the surface spot laser can be set.

As shown in FIG. 1 and FIG. 2, in some embodiments, the first metal portion 200 is arranged on a side of the second intermetallic compound portion 1331 facing a corresponding first electrode 112.

In this manner, before bonding, the first metal portion 200 may be formed on the first electrode 112 by deposition, etching, or other techniques, and the second metal portion 300 may be formed on a side of the first metal portion 200 facing away from the first electrode 112. Alternatively, the second metal portion 300 may be formed on the second electrode 121 of the light-emitting diode 120 by deposition, etching, or other techniques. After the bonding is completed, the second intermetallic compound portion 1331 formed in the second region AD2 is on a side of the first metal portion 200 facing away from the first electrode 112.

Therefore, before the bonding, the first metal portion 200 may be formed on the first electrode 112, and the second metal portion 300 may be formed on the side of the first metal portion 200 facing away from the first electrode 112. Alternatively, the first metal portion 200 may be formed on the first electrode 112, and the second metal portion 300 may be formed on the second electrode 121 of the light-emitting diode 120. Techniques and structure forms of the first metal portion 200 and the second metal portion 300 may be reasonably set according to needs.

As shown in FIG. 1 and FIG. 3, in some embodiments, the first metal portion 200 is arranged on a side of the second intermetallic compound portion 1331 facing away from a corresponding first electrode 112.

In this manner, the first metal portion 200 may be formed on the light-emitting diode 120 by deposition, etching, or other techniques before the bonding, for example, the first metal portion 200 may be formed on the second electrode 121 of the light-emitting diode 120. The second metal portion 300 may be formed on the side of the first metal portion 200 facing the first electrode 112, or the second metal portion 300 may be formed on the first electrode 112. After the bonding is completed, the second intermetallic compound portion 1331 formed in the second region AD2 is on the side of the first metal portion 200 close to the first electrode 112.

In this manner, the techniques and the forms of the first metal portion 200 and the second metal portion 300 may be reasonably set according to needs.

As shown in FIG. 1 and FIG. 4, in some embodiments, the first metal portion 200 is arranged on a side of the second intermetallic compound portion 1331 facing a corresponding first electrode 112; alternatively, the first metal portion 200 is arranged on a side of the second intermetallic compound portion 1331 facing away from a corresponding first electrode 112.

In this manner, the first metal portion 200 and the second metal portion 300 are formed on both the first electrode 112 and the second electrode 121 of the light-emitting diode 120. The first metal portion 200 on the first electrode 112 is between the second metal portion 300 on the first electrode 112 and the first electrode 112. The first metal portion 200 on the second electrode 121 is between the second electrode 121 and the second metal portion 300 on the second electrode 121. In this manner, after the bonding is completed, the first metal portion 200 remains on each of the side of the second intermetallic compound portion 1331 facing the first electrode 112 in the second region AD2 and the side of the second intermetallic compound portion 1331 facing the second electrode 121 in the second region AD2.

In this manner, it is conducive to better improving the reliability of the bonding connections between the light-emitting diodes 120 and the first electrodes 112 of the array substrate 110.

As shown in FIG. 3, in some embodiments, the thickness h1 of the first metal portion 200 satisfies 0.7 μm≤h1≤1.4 μm.

In an embodiment, the thickness h1 of the first metal portion 200 may be 0.7 μm, 0.8 μm, 0.9 μm, 1 μm, 1.1 μm, 1.2 μm, 1.3 μm, 1.4 μm, etc.

After systematic analysis and long-term practice by the inventors, it is found that when the thickness h1 of the first metal portion 200 satisfies: 0.7 μm≤h1≤1.4 μm, the bonding layer 130 can have a relatively low thickness on the premise of ensuring the stability of the bonding connections between the first electrodes 112 and the light-emitting diodes 120. In this manner, it is conducive to reducing the thickness of the display panel 100.

As shown in FIG. 3, in some embodiments, the thickness h2 of the second intermetallic compound portion 1331 satisfies that 0.7 μm≤h2≤1.4 μm.

In an embodiment, the thickness h2 of the second intermetallic compound portion 1331 may be 0.7 μm, 0.8 μm, 0.9 μm, 1 μm, 1.1 μm, 1.2 μm, 1.3 μm, 1.4 μm, etc.

After systematic analysis and long-term practice by the inventors, it is found that when the thickness h2 of the first metal portion 1331 satisfies that 0.7 μm≤h2≤1.4 μm, the bonding layer 130 can have a relatively low thickness on the premise of ensuring the stability of the bonding connection between the first electrode 112 and the light-emitting diode 120. In this manner, it is conducive to reducing the thickness of the display panel 100.

As shown in FIG. 1, in some embodiments, the second region AD2 surrounds the circumference of the first region AD1.

The edge region of the surface spot laser surrounds the circumference of the center region of the surface spot laser. In the case where a corresponding region of the display panel 100 is irradiated with a spot, a formed second region AD2 surrounds the circumference of the first region AD1. Only when the same region of the display panel 100 is sequentially irradiated by the center regions and the edge regions of two surface spot lasers, the phenomenon that the second region AD2 on the peripheral side of the first region AD1 is interrupted can occur. Therefore, the second region AD2 surrounds the circumference of the first region AD1. That is, the light-emitting diode region AD of the display panel 100 cannot be sequentially irradiated by the center regions and the edge regions of the two surface spot lasers, or is not sequentially irradiated by the center regions of the two surface spot lasers. In this manner, it is conducive to reducing the risk of an ineffective bonding connection between the light-emitting diode 120 and the first electrode 112, and reducing the risk of damage to related structures of the display panel 100 due to excessive laser irradiation on the light-emitting diode region AD of the display panel 100.

Figure 6:
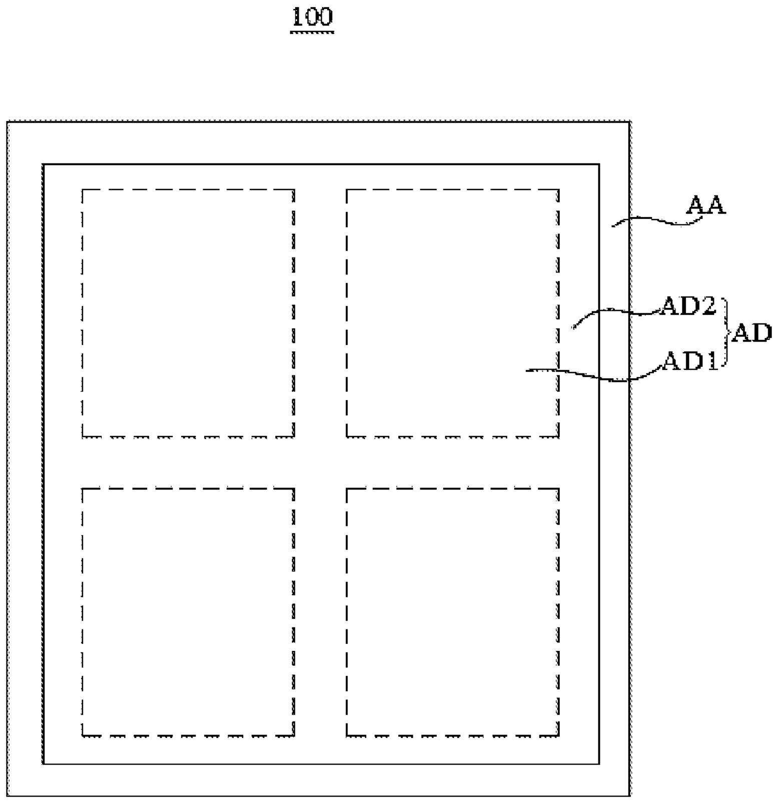
FIG. 6 is a top view of another display panel according to an embodiment of the present application.

As shown in FIG. 6, in some embodiments, the display panel 100 includes a plurality of light-emitting diode regions AD, each light-emitting diode region AD is rectangular, and the second region AD2 surrounds the circumference of the first region AD1.

In this manner, the first region AD1 may be rectangular, the light-emitting diode region AD is rectangular, the second region AD2 surrounds a circumference of the first region AD1, and the second region AD2 is square ring-like. In this manner, the corresponding surface spot laser is also rectangular.

In an embodiment, the first region AD1, the light-emitting diode region AD and the surface spot laser may be rectangular or square, which may be set according to actual needs.

The plurality of light-emitting diode regions AD may be arranged adjacent to each other along one direction in the display region AA. Alternatively, the plurality of light-emitting diode regions AD may be arranged in two intersecting directions in the display region AA, and two adjacent light-emitting diode regions AD in either direction abut each other.

In this manner, in the process that the array substrate 110 and the temporary substrate 400 are irradiated, one surface spot laser may irradiate one light-emitting diode region AD, and the surface spot laser sequentially irradiates the plurality of light-emitting diode regions AD until all light-emitting regions are irradiated.

For bonding between an array substrate 110 and a temporary substrate 400 in a relatively large size, limitations of uniformity and an optical path system of the surface spot laser are considered, and the size of the surface spot laser has an upper limit. For example, the size of a commonly used spot laser is mostly less than 100 mm*100 mm. In this manner, for the bonding of the array substrate 110 and the temporary substrate 400 in a relatively large size, surface spot laser irradiation needs to be sequentially performed multiple times. Thus, in a process of the surface spot laser irradiations, it can be ensured that the surface spot laser is distributed on the irradiated regions of the array substrate 110 and the temporary substrate 400 as uniformly as possible to improve the bonding reliability.

In an embodiment, the plurality of light-emitting diode regions AD are set to occupy the same area. In this manner, surface spot lasers of the same size may be used to irradiate different light-emitting diode regions AD, and it is unnecessary to adjust the size of the surface spot laser.

It can be understood that, in a process that two adjacent light-emitting diodes 120 are irradiated, part of the second region AD2 may be irradiated twice by the surface spot laser. However, since the two irradiations correspond to the edge region of the surface spot laser, no first metal portion 200 in the second region AD2 melts. Moreover, since temperatures of the two irradiations are not high, reliability of the second region AD2 being repeatedly irradiated can be maintained.

Figure 15:
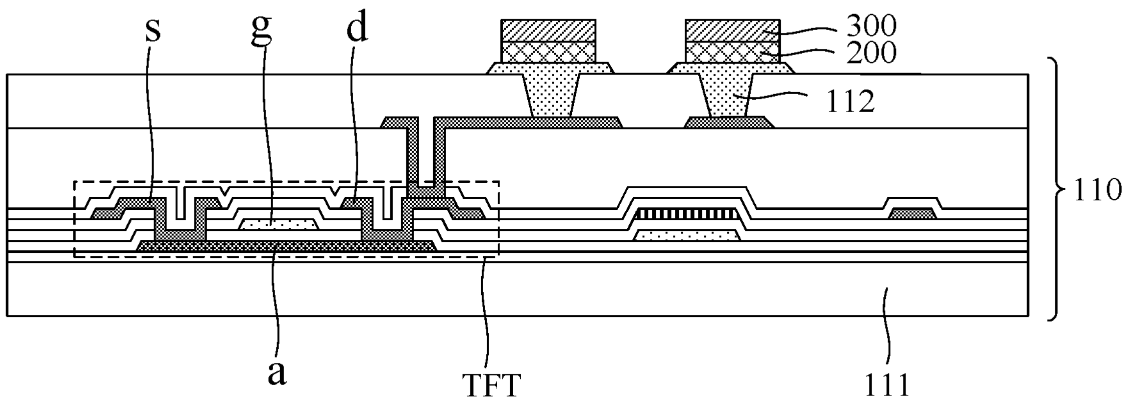
FIG. 15 is a sectional view of an array substrate according to an embodiment of the present application.

FIG. 15 is a sectional diagram of an array substrate according to an embodiment of the present application. As shown in FIG. 15, the array substrate 110 includes a base substrate 111, a first electrode 112 and a thin-film transistor (TFT) on the base substrate 111. The TFT includes an active layer a, a gate g, a source s, and a drain d. The first metal portion 200 and the second metal portion 300 may be arranged on the first electrode 112. The pixel driving circuit in the array substrate 110 may include structures such as the TFT and a capacitor.

Figure 16:
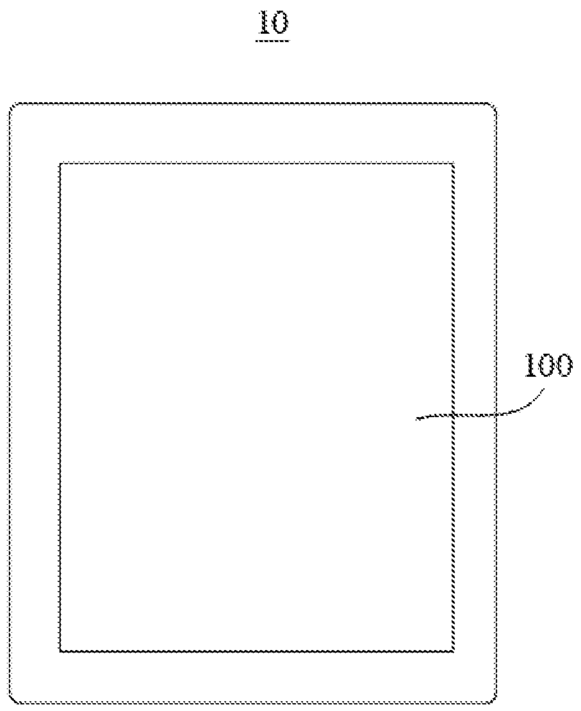
FIG. 16 is a top view of a display device according to an embodiment of the present application.

As shown in FIG. 16, an embodiment of the present application provides a display device 10 that includes the display panel 100 provided in any one of the preceding embodiments.

The display device 10 according to the embodiment of the present application includes but is not limited to devices with the display function, such as a mobile phone, a personal digital assistant (PDA), a tablet computer, an e-book, a television, an access control, an intelligent fixed-line telephone, and a console.

Since the embodiment of the present application provides a display device 10 that includes the display panel 100 provided in any one of the preceding embodiments, the display device 10 provided in the embodiment of the present application has the same beneficial effects, and details are not repeated here.

Figure 8:
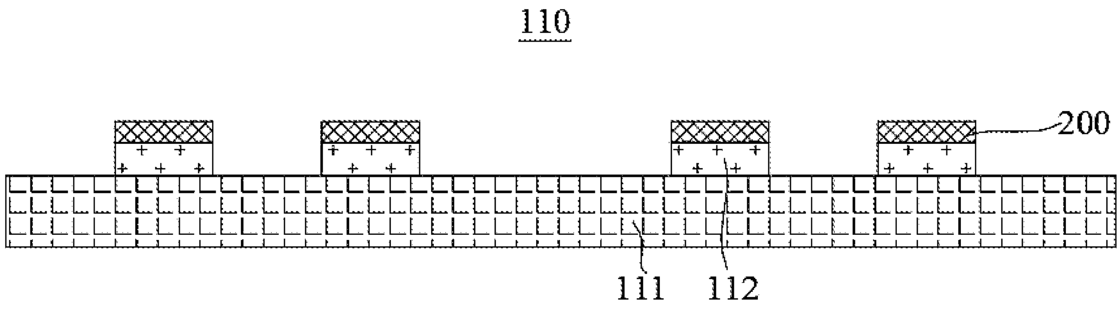
FIG. 8 is a sectional view of another array substrate according to an embodiment of the present application.
Figure 9:
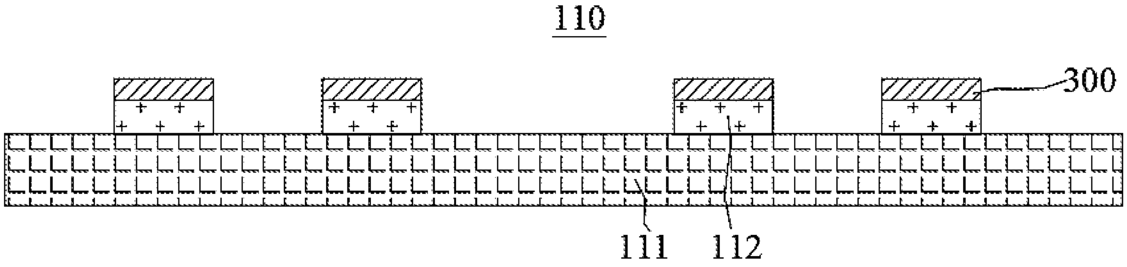
FIG. 9 is a sectional view of another array substrate according to an embodiment of the present application.
Figure 10:
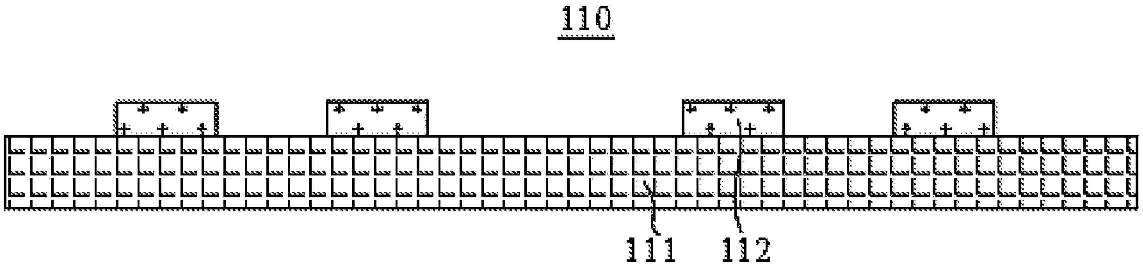
FIG. 10 is a diagram illustrating the structure of an array substrate for manufacturing a display panel according to an embodiment of the present application.

As shown in FIGS. 8 and 9, an embodiment of the present application also provides an array substrate 110. The array substrate 110 includes a base substrate 111 and first electrodes 112 arranged on one side of the array substrate 110. The array substrate 110 also includes first metal portions 200 or second metal portions 300, the first metal portions 200 or the second metal portions 300 are arranged on a side of the first electrodes 112 facing away from the base substrate 111, and the melting point of a second metal portion 300 is lower than the melting point of a first metal portion 200.

Figure 12:
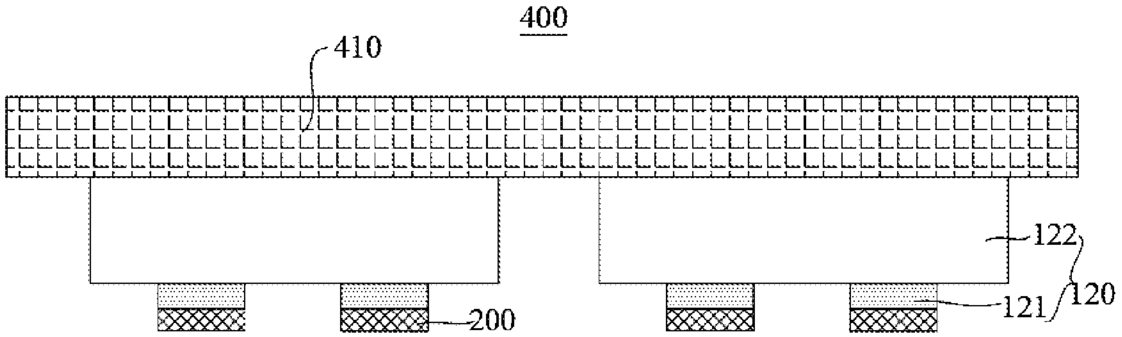
FIG. 12 is a sectional view of another temporary substrate according to an embodiment of the present application.
Figure 13:
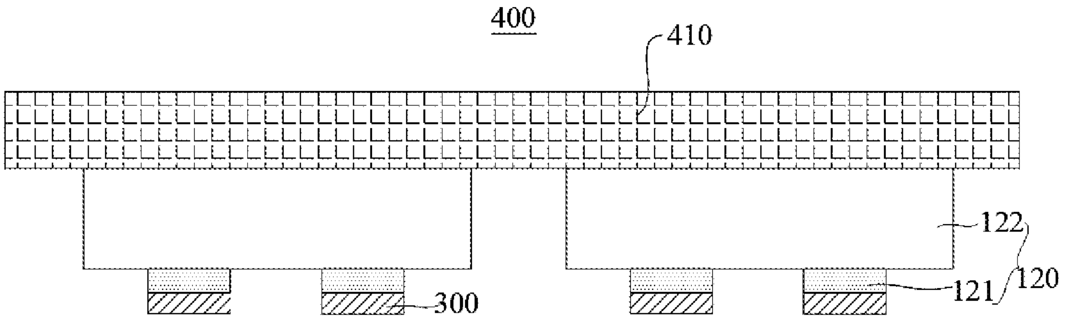
FIG. 13 is a sectional view of another temporary substrate according to an embodiment of the present application.
Figure 14:
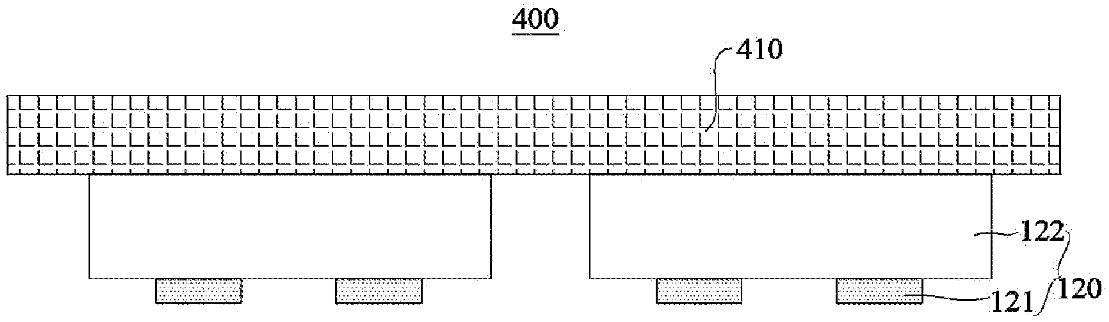
FIG. 14 is a diagram illustrating the structure of a temporary substrate for manufacturing a display panel according to an embodiment of the present application.

As shown in FIGS. 12 and 13, an embodiment of the present application also provides a temporary substrate 400. The temporary substrate 400 includes a temporary base substrate 410 and light-emitting diodes 120. The light-emitting diodes 120 are arranged on one side of the temporary base substrate 410, and each light-emitting diode 120 has a second electrode 121. The temporary substrate 400 also includes one of first metal portions 200 or second metal portions 300, and the one of the first metal portions 200 or the second metal portions 300 is arranged on a side of the second electrodes 121 facing away from the temporary base substrate 410. The melting point of a second metal portion 300 is lower than the melting point of a first metal portion 200.

It can be understood that for the array substrate 110 and the temporary substrate 400 provided in the present application, in a process of the mass transfer, the second electrode 121 of the light-emitting diode 120 and the first electrode 112 of the array substrate 110 are aligned with each other, and the array substrate 110 is used together with the temporary substrate 400. The one of the first metal portions 200 or the second metal portions 300 is arranged on the side of the first electrodes 112 of the array substrate 110 facing away from the base substrate 111, and the other one of the first metal portions 200 or the second metal portions 300 is arranged on the side of the second electrode 121 of the light-emitting diode 120 facing away from the temporary substrate 400. In this manner, the display panel 100 provided in the embodiment of the present application is formed after the mass transfer is performed on the temporary substrate 400 and the array substrate 110 that cooperate with each other.

According to the array substrate 110 and the temporary substrate 400 provided by the embodiments of the present application, the display panel 100 provided in the embodiment of the present application is manufactured after the mass transfer is performed on the temporary substrate 400 and the array substrate 110 that cooperate with each other. Therefore, in the process that a surface spot laser is used to perform the mass transfer on the temporary substrate 400 and the array substrate 110 used as a kit, a reasonable temperature of the surface spot laser is selected, so that the first metal portions 200 and the second metal portions 300 corresponding to the center region of the surface spot laser completely melt to form the first intermetallic compound portions 1321, and only the second metal portions 300 having a lower melting point among the first metal portions 200 and the second metal portions 300 corresponding to the edge region of the surface spot laser melt to form the second intermetallic compound portions 1331. Thus, a risk of short circuit of a light-emitting diode 120 caused by high fluidity of a melted first bonding portion 132 due to an excessively high temperature of the center region is reduced, and a risk of damage to the array substrate 110 due to the excessive high temperature is reduced. The poor bonding between the light-emitting diode 120 and the first electrode 112 due to an excessively low temperature in the edge region is better reduced, which is conducive to improving the production yield of the display panel 100.

As shown in FIG. 7, another embodiment of the present application provides an array substrate 110 that includes a base substrate 111, first electrodes 112, first metal portions 200, and second metal portions 300. The first electrodes 112 are arranged on one side of the base substrate 111. A first metal portion 200 is arranged on a side of a corresponding first electrode 112 facing away from the base substrate 111. A second metal portion 300 is arranged on a side of a corresponding first metal portion 200 facing away from the first electrode 112. The melting point of the second metal portion 300 is lower than the melting point of the first metal portion 200.

The array substrate 110 provided in this embodiment includes the first metal portions 200 and the second metal portions 300 and may cooperate with any temporary substrate 400 having the light-emitting diodes 120 for mass transfer. That is, the temporary substrate 400 that cooperates with the array substrate 110 for the mass transfer may have at least one of the first metal portions 200 and the second metal portions 300 deposited on the light-emitting diodes 120, or no additional film may be deposited on the light-emitting diodes 120 of the temporary substrate 400.

For another array substrate 110 provided by the embodiment of the present application, since the array substrate 110 includes both the first metal portions 200 and the second metal portions 300, the first metal portion 200 is arranged between the first electrode 112 and the second metal portion 300, and the melting point of the second metal portion 300 is lower than the melting point of the first metal portion 200. Then, the display panel 100 provided in the embodiment of the present application is formed after the mass transfer is performed on the temporary substrate 400 and the array substrate 110. Therefore, for the array substrate 110 provided by the embodiments of the present application, in the process of mass transfer, the risk of short circuit of the light-emitting diode 120 caused by high fluidity of a melted first bonding portion 132 due to an excessively high temperature of the center region of the surface spot laser is reduced, and poor bonding between the light-emitting diode 120 and the first electrode 112 due to an excessively low temperature of the edge region of the surface spot laser is better reduced, which is conducive to improving the production yield of the display panel 100.

As shown in FIG. 11, another embodiment of the present application provides a temporary substrate 400 that includes a temporary base substrate 410, light-emitting diodes 120, first metal portions 200, and second metal portions 300. The light-emitting diodes 120 are arranged on one side of the temporary base substrate 410, and each light-emitting diode 120 has a second electrode 121. A first metal portion 200 is arranged on a side of a corresponding second electrode 121 facing away from the temporary base substrate 410. A second metal portion 300 is arranged on a side of a corresponding first metal portion 200 facing away from the second electrode 121. The melting point of the second metal portion 300 is lower than the melting point of the first metal portion 200.

For the temporary substrate 400 provided by the embodiment of the present application, since the temporary substrate 400 includes both the first metal portions 200 and the second metal portions 300, the first metal portion 200 is arranged between the second metal portion 300 and the second electrode 121, and the melting point of the second metal portion 300 is lower than the melting point of the first metal portion 200. In this manner, the temporary substrate 400 provided in the embodiment of the present application can cooperate with any array substrate 110 provided in the embodiments of the present application for mass transfer, and the display panel 100 provided in the embodiments of the present application can be formed. Therefore, for the temporary substrate 400 provided by the embodiment of the present application, in a process of mass transfer, a risk of short circuit of a light-emitting diode 120 caused by high fluidity of a melted first bonding portion 132 due to an excessively high temperature of the center region of the surface spot laser is reduced, and the risk of damage of the light-emitting diode 120 due to the excessively high temperature is reduced. In addition, the poor bonding between the light-emitting diodes 120 and the first electrodes 112 due to an excessively low temperature of the edge region of the surface spot laser is reduced, which is conducive to improving the production yield of the display panel 100.

As shown in FIG. 17, an embodiment of the present application provides a manufacturing method of a display panel. The manufacturing method includes the following steps: An array substrate and a temporary substrate are provided, a first electrode is aligned with a corresponding second electrode, and the array substrate and the temporary substrate are irradiated by using a surface spot laser.

The array substrate includes a base substrate and first electrodes, and the first electrodes are arranged on one side of the base substrate. The temporary substrate includes a temporary base substrate and light-emitting diodes. The light-emitting diodes are arranged on one side of the temporary base substrate, each light-emitting diode has a second electrode and a body portion, and the second electrode is arranged on a side of the body portion facing away from the temporary base substrate.

The array substrate also includes one of first metal portions or second metal portions, and the one of the first metal portions or the second metal portions is arranged on a side of the first electrodes facing away from the base substrate. The melting point of a second metal portion is lower than the melting point of a first metal portion. The temporary substrate also includes the other one of the first metal portions or the second metal portions, and the other one of the first metal portions or the second metal portions is arranged on a side of the second electrodes facing away from the temporary base substrate.

Alternatively, the array substrate also includes first metal portions and second metal portions, and/or the temporary substrate also includes first metal portions and second metal portions. In the array substrate, a first metal portion is arranged on a side of a corresponding first electrode facing away from the base substrate, a second metal portion is arranged on a side of a corresponding first metal portion facing away from a corresponding first electrode, and the melting point of the second metal portion is lower than the melting point of the first metal portion. In the temporary substrate, a first metal portion is arranged on a side of a corresponding second electrode facing away from the temporary base substrate, a second metal portion is arranged on a side of a corresponding first metal portion facing away from a corresponding second electrode, and the melting point of the second metal portion is lower than the melting point of the first metal portion.

The first electrode is aligned with the corresponding second electrode such that a corresponding first metal portion and a corresponding second metal portion are located between the first electrode and the corresponding second electrode.

The array substrate and the temporary substrate are irradiated by using the surface spot laser such that all first metal portions and second metal portions irradiated by a center region of the surface spot laser melt and such that second metal portions irradiated by an edge region of the surface spot laser melt and first metal portions irradiated by the edge region of the surface spot laser do not melt.

Figure 18:
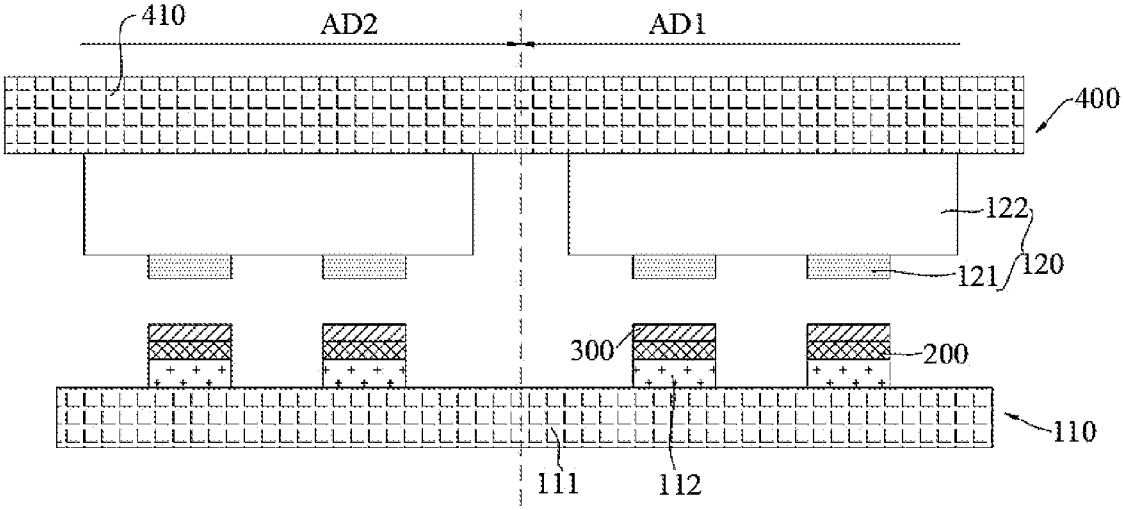
FIG. 18 is a diagram illustrating the structure of an array substrate and a temporary substrate in an alignment process of a first electrode and a second electrode in a manufacturing method of a display panel according to an embodiment of the present application.
Figure 19:
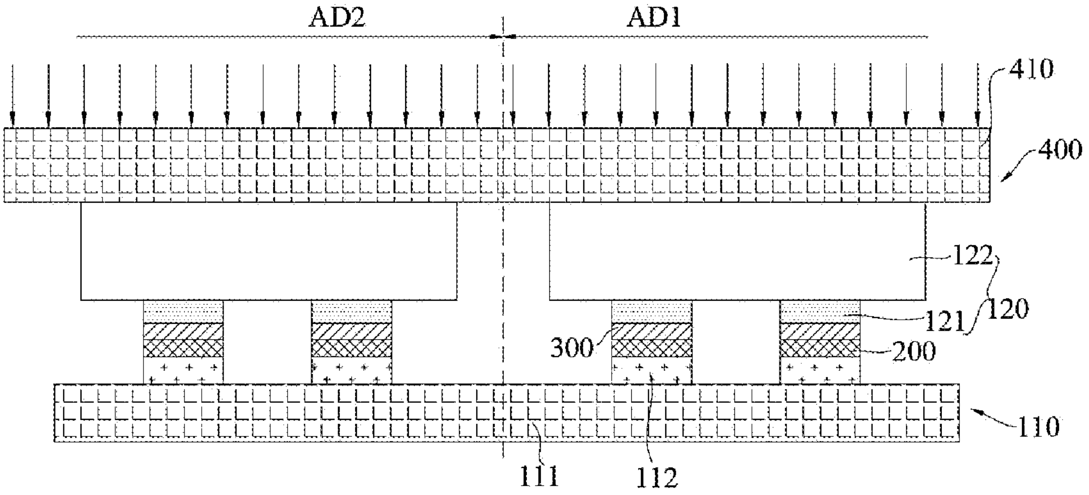
FIG. 19 is a diagram illustrating that an array substrate and a temporary substrate are irradiated by using a surface spot laser in a manufacturing method of a display panel according to an embodiment of the present application.
Figure 20:
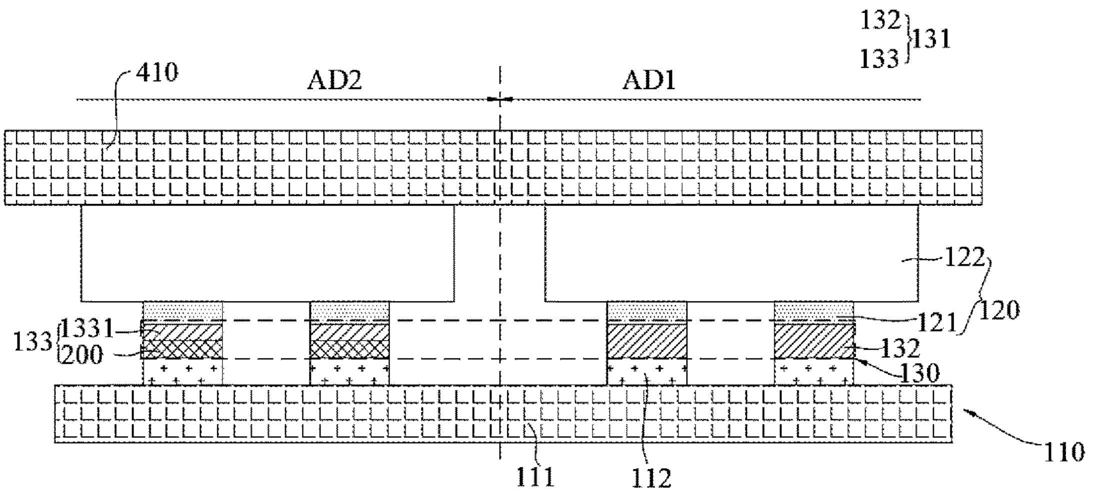
FIG. 20 is a diagram illustrating an array substrate and a temporary substrate that have been irradiated by using a surface spot laser in a manufacturing method of a display panel according to an embodiment of the present application.
Figure 21:
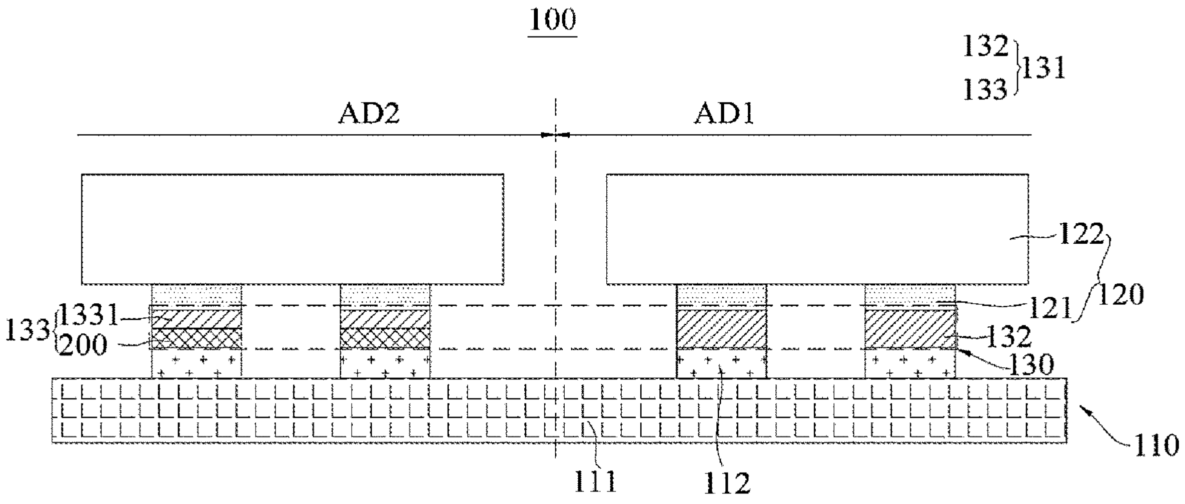
FIG. 21 is a diagram illustrating the structure of a display panel formed after a temporary base substrate is removed from a temporary substrate in a manufacturing method of a display panel according to an embodiment of the present application.

FIG. 18 is a diagram illustrating structures of an array substrate 110 and a temporary substrate 400 in an alignment process of a first electrode 112 and a second electrode 121. FIG. 19 illustrates that an array substrate 110 and a temporary substrate 400 are irradiated by using a surface spot laser, where arrows arranged in an array above the temporary base substrate 410 illustrate the surface spot laser. FIG. 20 illustrates that a first intermetallic compound portion 1321 and a second intermetallic compound portion 1331 are generated after an array substrate 110 and a temporary substrate 400 are irradiated by using a surface spot laser. FIG. 21 is a diagram illustrating the structure of a display panel 100 formed after a temporary base substrate 410 is removed from a temporary substrate 400.

In the step of providing the array substrate 110 and the temporary substrate 400, the array substrate 110 and the temporary substrate 400 may be the array substrate 110 provided in the preceding embodiments and the temporary substrate 400 provided in the preceding embodiments. Alternatively, the array substrate 110 and the temporary substrate 400 may not be the array substrate 110 provided in the preceding embodiments or the temporary substrate 400 provided in the preceding embodiments. However, at least one of the array substrate 110 and the temporary substrate 400 is the array substrate 110 provided in the preceding embodiments and the temporary substrate 400 provided in the preceding embodiments. In addition, the display panel 100 provided in any embodiment of the present application is formed after the array substrate 110 is used together with the temporary substrate 400 for mass transfer.

In an embodiment, one of the first metal portions 200 or the second metal portions 300 is arranged on a side of the first electrodes 112 of the array substrate 110 facing away from the base substrate 111, and the other one of the first metal portions 200 or the second metal portions 300 facing away from the temporary substrate 400 is arranged on the light-emitting diodes 120 of the temporary substrate 400. Alternatively, the first metal portions 200 and the second metal portions 300 are arranged on the light-emitting diodes 120 of the temporary substrate 400, and the opposite surfaces of the temporary substrate 400 and the array substrate 110 are the opposite surfaces of the first metal portions 200 and the second metal portions 300.

Alternatively, in another embodiment, the array substrate 110 includes the first metal portions 200 and the second metal portions 300, and a first metal portion 200 is located between a corresponding second metal portion 300 and a corresponding first electrode 112. In this case, the temporary substrate 400 may be any temporary substrate 400 provided in the embodiments of the present application. Alternatively, the temporary substrate 400 may not be any temporary substrate 400 provided in the embodiments of the present application. That is, the temporary substrate 400 may not be provided with the first metal portions 200 or the second metal portions 300. It can be understood that the material of the second electrode 121 of the light-emitting diodes 120 in the temporary substrate 400 may include the Au element.

Alternatively, in another embodiment, the array substrate 110 includes the first metal portions 200 and the second metal portions 300, and a first metal portion 200 is between a corresponding second metal portion 300 and a corresponding light-emitting diode 120. In this case, the temporary substrate 400 may be any temporary substrate 400 provided in the embodiments of the present application. Alternatively, the temporary substrate 400 may not be the temporary substrate 400 provided in the embodiments of the present application. That is, the temporary substrate 400 may not be provided with the first metal portions 200 or the second metal portions 300.

In an embodiment, the material of the first electrodes 112 of the array substrate 110 may include the Au element. In an embodiment, the first electrodes 112 of the array substrate 110 may include a titanium/aluminum/titanium stack metal layer. In an embodiment, the first electrodes 112 of the array substrate 110 may include an indium tin oxide (ITO).

In the step of aligning the first electrodes 112 with the corresponding second electrodes 121, the first electrodes 112 and the second electrodes 121 are in one-to-one correspondence. At least one layer of the first metal portions 200 and at least one layer of the second metal portions 300 are between the first electrodes 112 and the second electrodes 121. In addition, the second metal portions 300 of at least one of the array substrate 110 and the temporary substrate 400 face the other one of the array substrate 110 and the temporary substrate 400. In this manner, the other one of the array substrate 110 and the temporary substrate 400 can be combined after the second metal portions 300 are melted subsequently.

In the step of irradiating the array substrate 110 and the temporary substrate 400 by using the surface spot laser, all first metal portions 200 and second metal portions 300 between the first electrodes 112 and the second electrodes 121 irradiated by the center region of the surface spot laser melt and solidify to form first intermetallic compound portions 1321, and only second metal portions 300 between the first electrodes 112 and the second electrodes 121 irradiated by the edge region of the surface spot laser melt and solidify to form second intermetallic compound portions 1331. In this manner, an electrical connection between a first electrode 112 and a corresponding second electrode 121 can be realized, that is, the mass transfer for the light-emitting diodes 120 can be completed.

That is, after the array substrate 110 and the temporary substrate 400 are irradiated by using the surface spot laser, the first bonding portions 132 are formed between the first electrodes 112 and the second electrodes 121 that correspond to the center region of the surface spot laser, and the second bonding portions 133 are formed between the first electrodes 112 and the second electrodes 121 that correspond to the edge region of the surface spot laser. In this manner, the center region of the surface spot laser corresponds to the first region AD1 in the display region AA of the display panel 100 provided in the embodiments of the present application, and the edge region of the surface spot laser corresponds to the second region AD2 of the display panel 100 provided in the embodiments of the present application. The display panel 100 provided in the embodiments of the present application can be manufactured and formed by using the manufacturing method of the display panel 100 provided in the embodiments of the present application.

According to the manufacturing method of a display panel provided in the embodiments of the present application, in the process of performing the mass transfer on light-emitting diodes 120, an appropriate temperature is set for the surface spot laser such that all first metal portions 200 and second metal portions 300 between the first electrodes 112 and the second electrodes 121 that correspond to the center region of the surface spot laser melt and solidify to form the first intermetallic compound portions 1321, and such that first metal portions 200 between the first electrodes 112 and the second electrodes 121 that correspond to the edge region of the surface spot laser do not melt and second metal portions 300 between the first electrodes 112 and the second electrodes 121 that correspond to the edge region of the surface spot laser melt and solidify to form the second intermetallic compound portions 1331. In this manner, in a process of performing the mass transfer on the light-emitting diodes, a risk of short circuit of the light-emitting diode 120 caused by high fluidity of the melted first bonding portion 132 due to an excessively high temperature of the center region of the surface spot laser is reduced, and the poor bonding between the light-emitting diodes 120 and the first electrodes 112 due to an excessively low temperature of the edge region of the surface spot laser is also reduced, which is conducive to improving the production yield of the display panel 100.

The present application has been described with reference to alternative embodiments, but without departing from the scope of the present application, various modifications may be made thereto and components therein may be replaced with equivalents. In particular, the various technical features mentioned in the various embodiments may be combined in any manner as long as there is no structural conflict. The present application is not limited to the embodiments disclosed herein, but includes all technical schemes falling within the scope of the claims.

What is claimed is:

1. A display panel, comprising a display region, wherein the display region comprises a light-emitting diode region, the light-emitting diode region comprises a first region and a second region, the second region surrounds at least part of the first region, and the display panel comprises:

an array substrate that comprises first electrodes;

a plurality of light-emitting diodes arranged on one side of the array substrate; and a bonding layer arranged between the first electrodes and the plurality of light-emitting diodes, wherein the bonding layer comprises a plurality of discrete bonding portions, a bonding portion of the plurality of bonding portions connects a light-emitting diode of the plurality of light-emitting diodes and a corresponding first electrode, and the plurality of bonding portions comprise first bonding portions and second bonding portions, wherein the first bonding portions are in the first region, a first bonding portion of the first bonding portions comprises a first intermetallic compound portion, at least one of the second bonding portions is in the second region, a second bonding portion of the second bonding portions comprises a first metal portion and a second intermetallic compound portion that are stacked, the first intermetallic compound portion comprises first metal elements and second metal elements, the first metal portion comprises first metal elements, the second intermetallic compound portion comprises second metal elements, and a melting point of a pure metal formed from the second metal elements or a melting point of an alloy formed from the second metal elements is lower than a melting point of a pure metal formed from the first metal elements or a melting point of an alloy formed from the first metal elements;

wherein a plurality of second bonding portions among the second bonding portions are arranged in the second region, and mass contents of first metal elements in second intermetallic compound portions of the plurality of second bonding portions decrease incrementally along a direction away from the first region.

2. The display panel of claim 1, wherein a thickness of the first intermetallic compound portion is e1, and a sum of a thicknesses of the second intermetallic compound portion and a thickness of the first metal portion is e2, wherein e1≥e2.

3. The display panel of claim 1, wherein a light-emitting diode of the plurality of light-emitting diodes comprises a second electrode, and the second electrode is electrically connected to a corresponding first electrode by the bonding layer; and a material of the second electrode comprises an *aurum* (Au) element, the first intermetallic compound portion and the second intermetallic compound portion each further comprise an Au element, and a mass content of the Au element in the first intermetallic compound portion is higher than a mass content of the Au element in the second intermetallic compound portion.

4. The display panel of claim 3, wherein mass contents of Au elements in the second intermetallic compound portions of the plurality of second bonding portions decrease incrementally along a direction away from the first region.

5. The display panel of claim 1, wherein a mass content of first metal elements in the second intermetallic compound portion is lower than a mass content of first metal elements in the first intermetallic compound portion.

6. The display panel of claim 1, wherein a thickness of the second intermetallic compound portion is smaller than a thickness of the first metal portion.

7. The display panel of claim 1, wherein the melting point of the pure metal formed from the first metal elements or the melting point of the alloy formed from the first metal elements is T1, and the melting point of the pure metal formed from the second metal elements or the melting point of the alloy formed from the second metal elements is T2, wherein 50° C.≤T1−T2≤100° C.

8. The display panel of claim 1, wherein the first metal elements comprise a tin element, and the second metal elements comprise an indium element; or the second metal elements comprise a tin element and a bismuth element, and the first metal elements comprise a tin element and a zinc element.

9. The display panel of claim 1, wherein the first metal portion is arranged on a side of the second intermetallic compound portion facing a corresponding first electrode; and/or the first metal portion is arranged on a side of the second intermetallic compound portion facing away from a corresponding first electrode.

10. The display panel of claim 1, wherein a thickness h1 of the first metal portion satisfies: 0.7 μm≤h1≤1.4 μm; and/or a thickness h2 of the second intermetallic compound portion satisfies: 0.7 μm≤h2≤1.4 μm.

11. The display panel of claim 1, wherein the second region surrounds a circumference of the first region.

12. The display panel of claim 1, wherein the display region comprises a plurality of light-emitting diode regions, each of the plurality of light-emitting diode regions is rectangular, and the second region surrounds a circumference of the first region.

13. A display device, comprising the display panel of claim 1.

14. The display device of claim 13, wherein a thickness of the first intermetallic compound portion is e1, and a sum of a thicknesses of the second intermetallic compound portion and a thickness of the first metal portion is e2, wherein e1≥e2.

15. The display device of claim 13, wherein a light-emitting diode of the plurality of light-emitting diodes comprises a second electrode, and the second electrode is electrically connected to a corresponding first electrode by the bonding layer; and a material of the second electrode comprises an *aurum* (Au) element, the first intermetallic compound portion and the second intermetallic compound portion each further comprise an Au element, and a mass content of the Au element in the first intermetallic compound portion is higher than a mass content of the Au element in the second intermetallic compound portion.

16. The display device of claim 15, wherein mass contents of Au elements in the second intermetallic compound portions of the plurality of second bonding portions decrease incrementally along a direction away from the first region.

17. The display device of claim 13, wherein a mass content of first metal elements in the second intermetallic compound portion is lower than a mass content of first metal elements in the first intermetallic compound portion.

18. A display panel, comprising a display region, wherein the display region comprises a light-emitting diode region, the light-emitting diode region comprises a first region and a second region, the second region surrounds at least part of the first region, and the display panel comprises:

an array substrate that comprises first electrodes;

a plurality of light-emitting diodes arranged on one side of the array substrate; and a bonding layer arranged between the first electrodes and the plurality of light-emitting diodes, wherein the bonding layer comprises a plurality of discrete bonding portions, a bonding portion of the plurality of bonding portions connects a light-emitting diode of the plurality of light-emitting diodes and a corresponding first electrode, and the plurality of bonding portions comprise first bonding portions and second bonding portions, wherein the first bonding portions are in the first region, a first bonding portion of the first bonding portions comprises a first intermetallic compound portion, the second bonding portions are in the second region and comprise first metal portions and second intermetallic compound portions, wherein a first metal portion and a second intermetallic compound portion in a same second bonding portion are stacked; the first intermetallic compound portion comprises a first metal element and a second metal element, the first metal portion comprises the first metal element, the second intermetallic compound portion comprises the second metal element, and a melting point of a pure metal formed from the second metal element or a melting point of an alloy formed from the second metal element is lower than a melting point of a pure metal formed from the first metal element or a melting point of an alloy formed from the first metal element;

wherein the second intermetallic compound portions surround a circumference of the first intermetallic compound portion.

19. A display panel, comprising a display region, wherein the display region comprises a light-emitting diode region, the light-emitting diode region comprises a first region and a second region, the second region surrounds at least part of the first region, and the display panel comprises:

an array substrate that comprises first electrodes;

a plurality of light-emitting diodes arranged on one side of the array substrate; and a bonding layer arranged between the first electrodes and the plurality of light-emitting diodes, wherein the bonding layer comprises a plurality of discrete bonding portions, a bonding portion of the plurality of bonding portions connects a light-emitting diode of the plurality of light-emitting diodes and a corresponding first electrode, and the plurality of bonding portions comprise first bonding portions and second bonding portions, wherein the first bonding portion s are in the first region, a first bonding portion of the first bonding portions comprises a first intermetallic compound portion, the second bonding portions are in the second region, a second bonding portion of the second bonding portions comprises a first metal portion and a second intermetallic compound portion that are stacked, the first intermetallic compound portion comprises a first metal element and a second metal element, the first metal portion comprises the first metal element, the second intermetallic compound portion comprises the second metal element, and a melting point of a pure metal formed from the second metal element or a melting point of an alloy formed from the second metal element is lower than a melting point of a pure metal formed from the first metal element or a melting point of an alloy formed from the first metal element;

wherein the plurality of light-emitting diodes comprises second electrodes, the first intermetallic compound portion is interposed between a corresponding first electrode and a corresponding second electrode, and directly contacts the corresponding first electrode and directly contacts the corresponding second electrode; the first metal portion and second intermetallic compound portion are interposed between a corresponding first electrode and a corresponding second electrode, the first metal portion directly contacts the corresponding first electrode, and the second intermetallic compound portion directly contacts the corresponding second electrode;

wherein a thickness of the first intermetallic compound portion is e1, and a sum of a thicknesses of the second intermetallic compound portion and a thickness of the first metal portion is e2, wherein e1>e2.

* * * * *